United States Patent
Kumar et al.

(10) Patent No.: US 6,576,929 B2
(45) Date of Patent: Jun. 10, 2003

(54) SILICON CARBIDE SEMICONDUCTOR DEVICE AND MANUFACTURING METHOD

(75) Inventors: Rajesh Kumar, Kariya (JP); Takamasa Suzuki, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/135,522

(22) Filed: May 1, 2002

(65) Prior Publication Data

US 2002/0167011 A1 Nov. 14, 2002

(30) Foreign Application Priority Data

May 8, 2001 (JP) .................................. 2001-137822
May 21, 2001 (JP) .................................. 2001-151594

(51) Int. Cl.[7] .................... H01K 29/78; H01K 31/028
(52) U.S. Cl. ..................... 257/77; 257/289; 257/341
(58) Field of Search ................... 257/77, 279, 281, 257/329, 288, 328, 289

(56) References Cited

U.S. PATENT DOCUMENTS

| 5,396,085 | A | | 3/1995 | Baliga | |
|---|---|---|---|---|---|
| 6,297,100 | B1 | * | 10/2001 | Kumar et al. | 438/268 |
| 6,303,947 | B1 | * | 10/2001 | Ueno | 257/77 |
| 6,323,506 | B1 | * | 11/2001 | Alok | 257/77 |
| 6,452,228 | B1 | * | 9/2002 | Okuno et al. | 257/329 |
| 6,455,892 | B1 | * | 9/2002 | Okuno et al. | 257/328 |
| 6,465,807 | B1 | * | 10/2002 | Ueno | 257/77 |
| 6,482,704 | B1 | * | 11/2002 | Amano et al. | 438/285 |

FOREIGN PATENT DOCUMENTS

EP 0167810 6/1985

* cited by examiner

*Primary Examiner*—John F. Niebling
*Assistant Examiner*—Walter L. Lindsay, Jr.
(74) *Attorney, Agent, or Firm*—Posz & Bethards, PLC

(57) ABSTRACT

A channel layer 4 is formed on an n⁻-type epitaxial layer 2 and first gate areas 3, and field enhanced area(s) 5 and second gate areas 6 are formed on the first gate areas 3. Furthermore, n⁺-type source areas 7 and a third gate area 8 are formed on the second gate areas 6. These steps result in a device structure having a first J-FET with the n⁺-type source areas 7 and the n⁺-type substrate 1 as a source and drain and the first gate areas 3 at the right and left in the figure as a gate; and the second J-FET with the n⁺-type source areas 7 and the n⁺-type substrate 1 as a source and drain and the second gate areas 6 and the third gate area 8 as a gate. The first J-FET is normally-on, while the second J-FET is normally-off.

28 Claims, 40 Drawing Sheets

SILICON CARBIDE SEMICONDUCTOR DEVICE AND MANUFACTURING METHOD

CROSS-REFERENCE TO RELATED APPLICATIONS

This application relates to and claims priority to Japanese Patent Application Nos. 2001-137822 filed on May 8, 2001 and 2001-151594, filed on May 21, 2001, the contents of which are hereby incorporated by reference.

BACKGROUND OF THE INVENTION

The present invention relates to a silicon carbide semiconductor device having a J-FET and a manufacturing method.

Efforts are underway to develop MOSFETs using SiC, but devices developed to date have not reached their full potential, because of inadequate mobility and reliability. On the other hand, it has been reported that normally-on J-FETs offer high voltage resistance and low on-resistance.

Such a semiconductor device, having a J-FET, is provided in, for example, U.S. Pat. No. 5,396,085. This semiconductor device operates as a normally-off transistor by having a combination of a normally-on J-FET made of SiC and an MOSFET made of silicon, having a low voltage resistance. This device is able to resist a small reverse bias voltage (low drain voltage) with the MOSFET made of silicon and to resist a large reverse bias voltage (high drain voltage) with a depletion layer extending out in the J-FET made of SiC.

This conventional semiconductor device, however, includes two types of semiconductor materials, which are silicon and SiC, and requires two chips. For this reason, this device has a large package and suffers from losses caused by wiring lines. Furthermore, this semiconductor device cannot operate at high temperature (for example, 200 degrees C. or above), because of the silicon MOSFET.

SUMMARY OF THE INVENTION

The present invention addresses this issue by providing a single chip, normally-off J-FET with low on-resistance. The objective of the present invention is to provide a silicon carbide semiconductor device that can operate at high temperature and a method of manufacturing such a device.

To achieve this objective, the invention is a silicon carbide semiconductor device, which includes a semiconductor substrate of a first conductance type made of silicon carbide, a semiconductor layer of the first conductance type made of silicon carbide of a higher resistance than the semiconductor substrate and formed on a main surface of the semiconductor substrate, first gate areas of a second conductance type formed on a surface of the semiconductor layer on both sides of a channel, which is formed in a prescribed area on the surface of the semiconductor layer, a channel layer of the first conductance type formed over the semiconductor layer and the first gate area, second gate areas of the second conductance type formed in isolation from the first gate area in the channel layer, high impurity concentration areas of the first conductance type formed in the channel layer, source areas of the first conductance type formed in positions above the first gate areas in the channel layer, a third gate area of the second conductance type formed above the channel layer or on the surface of the channel layer and having parts that face the second gate areas, source electrodes electrically connected to the first gate areas and the source areas, a gate electrode electrically connected to the third gate area, and a drain electrode formed on a backside of the semiconductor substrate.

DETAILED DESCRIPTION OF THE PREFERRED EMBODIMENTS

First Embodiment

Figure 1:
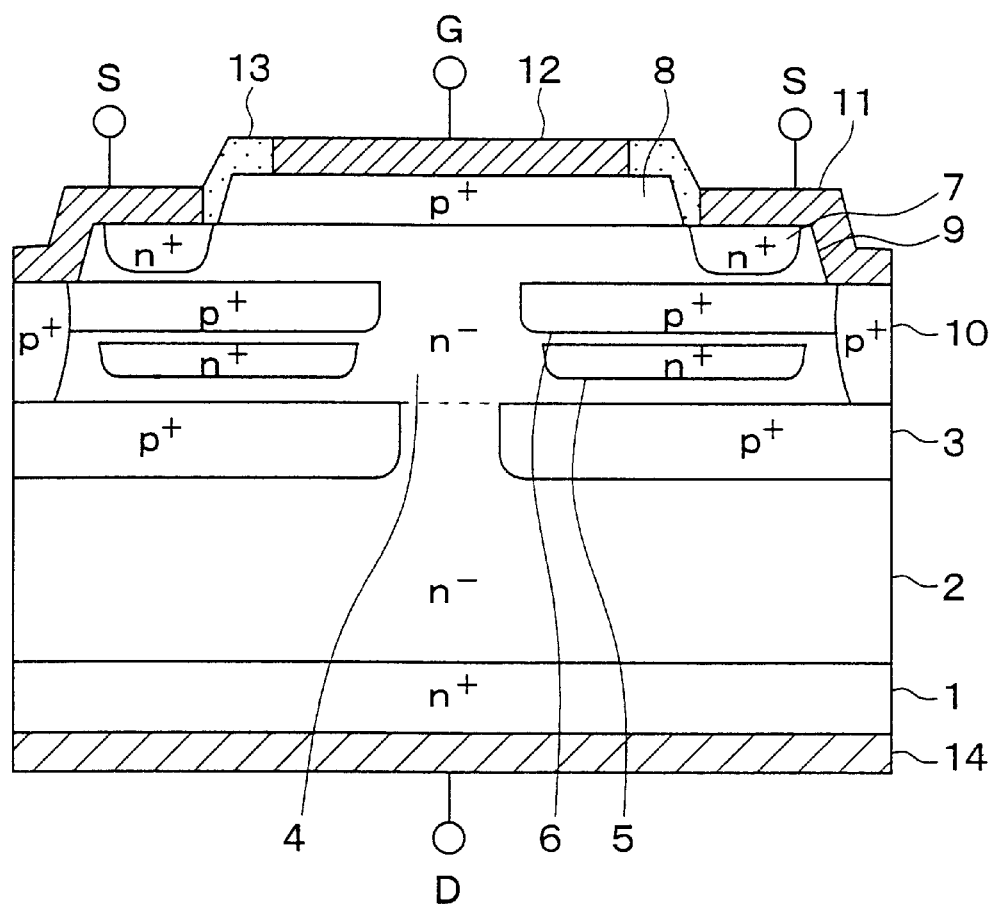
FIG. 1 is a cross sectional diagram of the silicon carbide semiconductor device of the first embodiment of the present invention.

FIG. 1 shows a cross-section of a single cell in the silicon carbide semiconductor device. An $n^+$-type substrate 1, consisting of silicon carbide, has a top, main and a bottom surface. The bottom surface is opposite to the main surface. An $n^-$-type epitaxial layer 2, consisting of silicon carbide, is grown epitaxially on the main surface of the $n^+$-type substrate 1. The $n^-$-type epitaxial layer 2 has a lower dopant concentration than the substrate 1.

At prescribed areas at the surface of the $n^-$-type epitaxial layer 2 are formed, symmetrically to the right and left in FIG. 1, first gate areas 3, each consisting of a $p^+$-type layer. A channel layer 4, consisting of an $n^-$-type layer, is grown epitaxially on the surface of the $n^-$type epitaxial layer 2 and also covers the first gate areas 3. Field enhanced areas 5, each consisting of an $n^+$-type layer, and second gate areas 6, each consisting of a $p^+$-type layer, are formed at the surface of the channel layer 4 above the first gate areas 3.

A plurality of $n^+$-type source areas 7 are formed above the second gate areas 6 at the surface of the channel layer 4. A third gate area 8 is formed at the surface of the channel layer 4 and covers the second gate areas 6.

Also formed in the channel layer 4 are grooves 9, which reach down to the second gate areas 6. Contact areas 10 are formed at the bottom of the grooves 9, and the contact areas 10 extend down to the first gate areas 3 to a level deeper than the field enhanced areas 5. The contact areas 10 provide electrical connection between the first gate areas 3 and the second gate areas 6.

Furthermore, source electrodes 11 are formed over the $n^+$-type source areas 7 and contact areas 10 to establish electrical contacts with the $n^+$-type source areas 7, as well as with the first gate areas 3 and second gate areas 6 via the contact areas 10. A gate electrode 12 is formed on top of the third gate area 8 for making electrical contact with the third gate area 8. The source electrodes 11 and gate electrode 12 are electrically isolated by the interlayer dielectric films 13. Formed on the back surface of the $n^+$-type substrate 1 is a drain electrode 14, which is electrically connected to the $n^+$-type substrate 1 to complete the structure of the silicon carbide semiconductor device.

The resulting silicon carbide semiconductor device includes a first J-FET, which includes the $n^+$-type source areas 7 and the $n^+$-type substrate 1 as source and drain and the first gate areas 3 on both sides of FIG. 1 as the gate, and a second J-FET, which includes the $n^+$-type source areas 7 and the $n^+$-type substrate 1 as source and drain and the second gate areas 6 and the third gate area 8 as the gate. With this embodiment, the first J-FET, out of the first and second J-FETs, operates as normally-on, while the second J-FET operates as normally-off. More particularly, a spacing between the first gate areas 3 on the right and left sides in FIG. 1 and the impurity concentration level in each part are set in such a way that the first J-FET operates as normally-on, while the spacing between the second and third gate areas 6 and 8 and the impurity concentration level in each part are set such that the second J-FET operates as normally-off.

Operation of the silicon carbide semiconductor device, as the device is turned off and turned on, will be described next.

Firstly, when the silicon carbide semiconductor device is turned off, or when a voltage is not applied to the gate electrode 12, depletion layers extending out of the second and third gate areas 6 and 8 pinch off the channel layer 4 and turn off the second J-FET. Although depletion layers also extend out of the first gate areas 3, the $n^-$-type epitaxial layer 2 does not get pinched off, because the spacing between the right and left first gate areas 3 in FIG. 1 is larger than the distances by which these depletion layers extend. Consequently, the first J-FET remains turned on.

When a reverse bias is applied to the device and a positive voltage is applied to the drain electrode 14, the channel in the second J-FET remains depleted due to the normally-off design, even though the channel in the first J-FET is not be depleted because of the normally-on design. Consequently, the voltage applied to the drain electrode 14 will be blocked, as long as the voltage level is low, As the voltage applied to the drain electrode 14 is gradually increased, the potential around the second gate areas 6 is increased. Because the field enhanced areas 5 are positioned below the second gate areas 6, the potential of the field enhanced areas 5 also goes up. Because the first gate areas 3 and the second gate areas 6 are connected to the source electrodes 11 and are grounded (potential=0 V), a reverse bias is applied between the field enhanced areas 5 and the first and second gate areas 3 and 6. Consequently, depletion layers from the first gate areas 3 stretch out and pinch off the channel in the first J-FET. Once the channel is pinched off, the potential no longer rises in the upper part of the first gate areas 3. Consequently, even when a higher voltage is applied to the drain electrode 14, the voltage is blocked by the first gate areas 3.

On the other hand, when the device is turned on, or when a voltage is applied to the gate electrode 12, a smaller depletion layer would stretch out of the third gate area 8, and the second J-FET is turned on. The first J-FET would also be turned on, because this J-FET is normally turned on. Because both the first and second J-FETs are turned on, currents would flow from the source electrodes 11 to the $n^+$-type source areas 7, the channel layer 4, the $n^-$-type epitaxial layer 2, the $n^+$-type substrate 1, and the drain electrode 14 in that order.

The device structure of this embodiment, therefore, would operate as a normally-off transistor and can resist a reverse bias.

This silicon carbide semiconductor device is basically made of one type of semiconductor material, which is silicon carbide. For this reason, the silicon carbide semiconductor device can be built into a single chip and will not require a large package. The device does not suffer from losses due to wire conductance. Because the device is made of silicon carbide and does not rely on silicon, high temperature operation (at above 200 degrees C., for example) is possible.

A method of manufacturing the silicon carbide semiconductor device in FIG. 1 will be described by referring to FIG. 2 through FIG. 8.

Figure 2A:
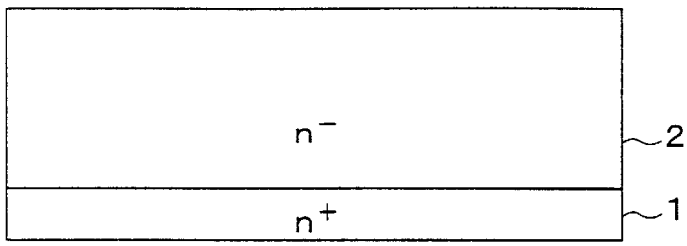
FIG. 2A is a cross sectional diagram showing a manufacturing process for the silicon carbide semiconductor device in FIG. 1.

Step Shown in FIG. 2A

Firstly, the $n^+$-type substrate 1 should be an n-type 4H, 6H, 3C, or 15R SiC substrate. For example, the $n^+$-type substrate 1 may be a 400 µm thick substrate, the main surface of which is a (0001) Si face or a (112-0) a face. A 5 µm thick $n^-$-type epitaxial layer 2 is grown epitaxially on a main surface of the substrate 1. Because the $n^-$-type epitaxial layer 2 would have the same crystal structure as the substrate 1 underneath, the crystal structure of this layer would be $n^-$-type 4H, 6H, 3C, or 15 R-SiC.

Figure 2B:
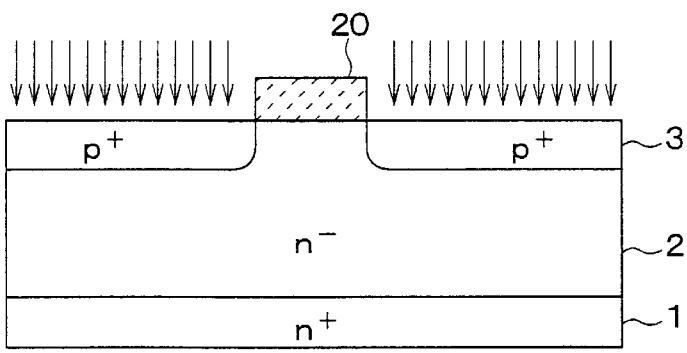
FIG. 2B is a cross sectional diagram showing a manufacturing process for the silicon carbide semiconductor device in FIG. 1.

Step Shown in FIG. 2B

After a low temperature oxide (LTO) film 20 is formed at prescribed areas on top of the $n^-$-type epitaxial layer 2, the LTO film 20 is patterned by photo lithography to open holes at prescribed areas. Ion implanting is next performed using the LTO film 20 as a mask. More specifically, boron or aluminum is ion implanted as a p-type impurity at positions where the first gate areas 3 are to be formed.

Figure 3A:
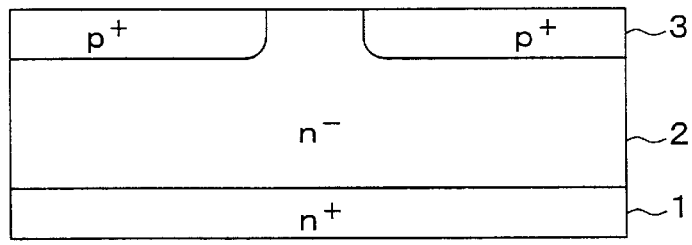
FIG. 3A is a cross sectional diagram showing a manufacturing process for the silicon carbide semiconductor device that follows FIG. 2.

Step Shown in FIG. 3A

After the LTO film 20 is stripped, implanted ions are activated with an anneal treatment in a furnace or by rapid thermal annealing to form the first gate areas 3. In order to keep the p-type impurities from diffusing, when forming these first gate areas 3, either aluminum, which does not diffuse too much under heat, or carbon and boron in an appropriate dose ratio (preferably 1:10 for boron:carbon) should be implanted in the step shown in FIG. 2B.

Figure 3B:
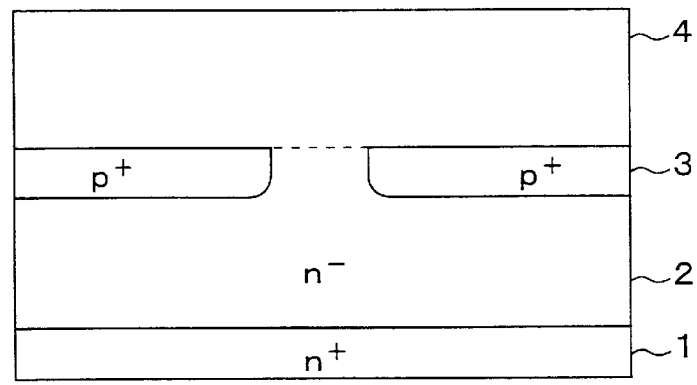
FIG. 3B is a cross sectional diagram showing a manufacturing process for the silicon carbide semiconductor device that follows FIG. 3A.

Step Shown in FIG. 3B

The channel layer 4, consisting of an n⁻-type film, is deposited by epitaxial growth on the n⁻-type epitaxial layer 2 to cover the first gate areas 3. In order to make the second J-FET operate as normally-off, impurity concentration level in the channel layer 4 should be lower than in the n⁻-type epitaxial layer 2.

Figure 4A:
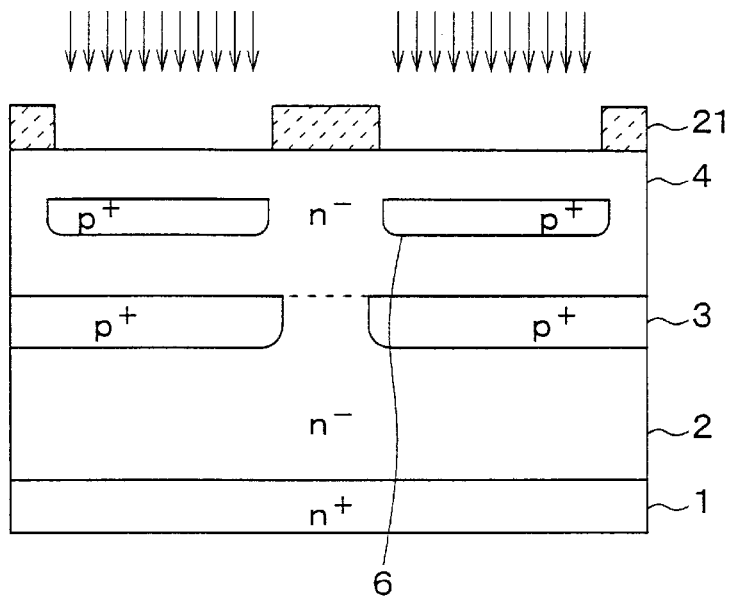
FIG. 4A is a cross sectional diagram showing a manufacturing process for the silicon carbide semiconductor device that follows FIG. 3.

Step Shown in FIG. 4A

After an LTO film 21 is grown on top of the channel layer 4, the LTO film 21 is patterned by photo lithography to open holes at prescribed areas. Using the LTO film 21 as a mask, ion implanting is performed. More specifically, boron or aluminum is ion implanted as a p-type impurity at positions where the second gate areas 6 are to be formed.

Figure 4B:
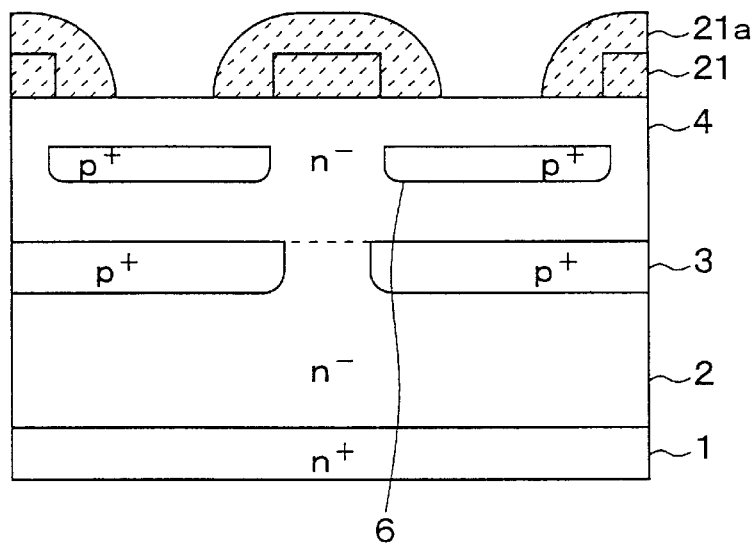
FIG. 4B is a cross sectional diagram showing a manufacturing process for the silicon carbide semiconductor device that follows FIG. 4A.

Step Shown in FIG. 4B

An oxide film 21a is deposited, while the LTO film 21 remains on the surface. Then, the oxide film 21a is etched to make the openings in the LTO film 21 smaller.

Figure 5A:
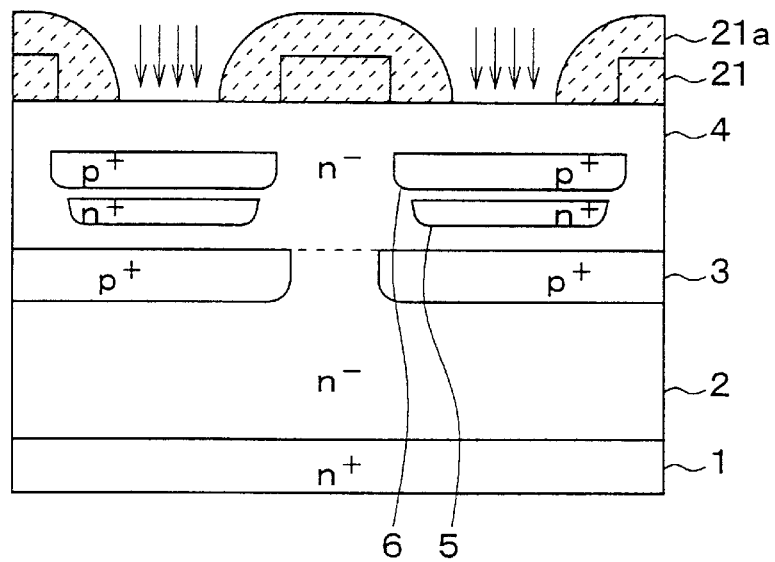
FIG. 5A is a cross sectional diagram showing a manufacturing process for the silicon carbide semiconductor device that follows FIG. 4.

Step Shown in FIG. 5A

Using the oxide film 21a and LTO film 21 as a mask, ion implanting is performed. More specifically, phosphorous (P) or nitrogen (N) is implanted as an n-type impurity at positions where the field enhanced areas 5 are to be formed.

Figure 5B:
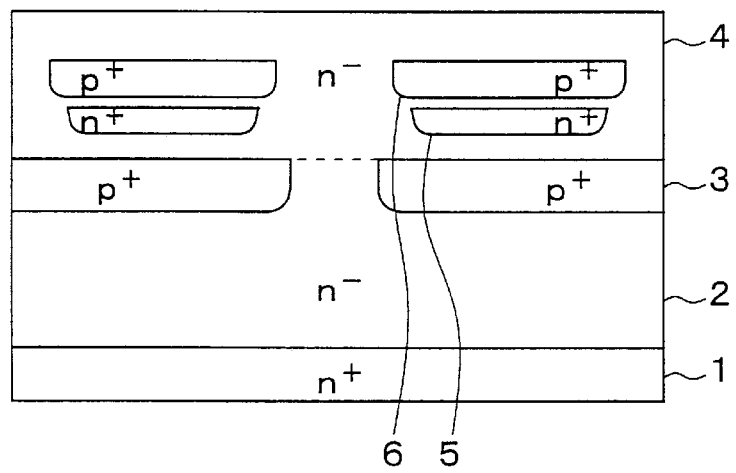
FIG. 5B is a cross sectional diagram showing a manufacturing process for the silicon carbide semiconductor device that follows FIG. 5A.

Step Shown in FIG. 5B

After the LTO film 21 and oxide film 21a are stripped, implanted ions are activated by an anneal treatment using a furnace or by rapid thermal annealing to form the field enhanced areas 5 and second gate areas 6. In order to keep the p-type impurities from diffusing too much as the second gate areas 6 are formed, either aluminum, which does not diffuse too much, or boron and carbon in an appropriate dose ratio (preferably 1:10 for boron:carbon) should be implanted during the step shown in FIG. 4A.

Figure 6A:
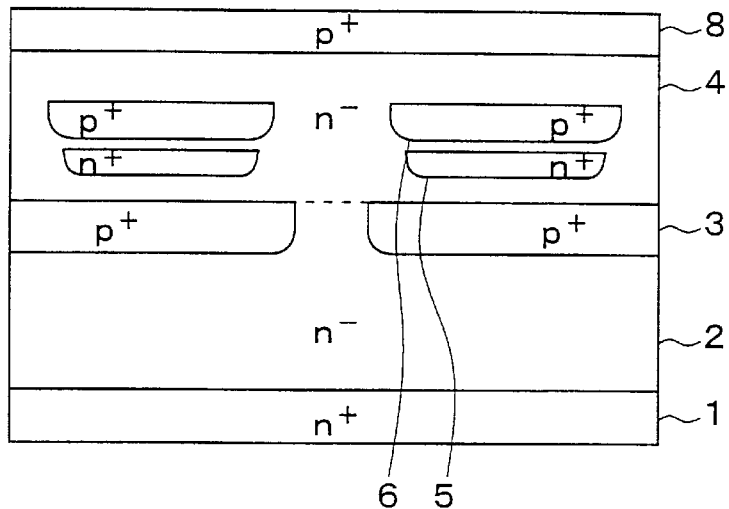
FIG. 6A is a cross sectional diagram showing a manufacturing process for the silicon carbide semiconductor device that follows FIG. 5.

Step Shown in FIG. 6A

The third gate area 8, consisting of a p⁺-type layer, is formed by epitaxial growth with a high dosage of p-type impurities on the surface of the channel layer 4.

Figure 6B:
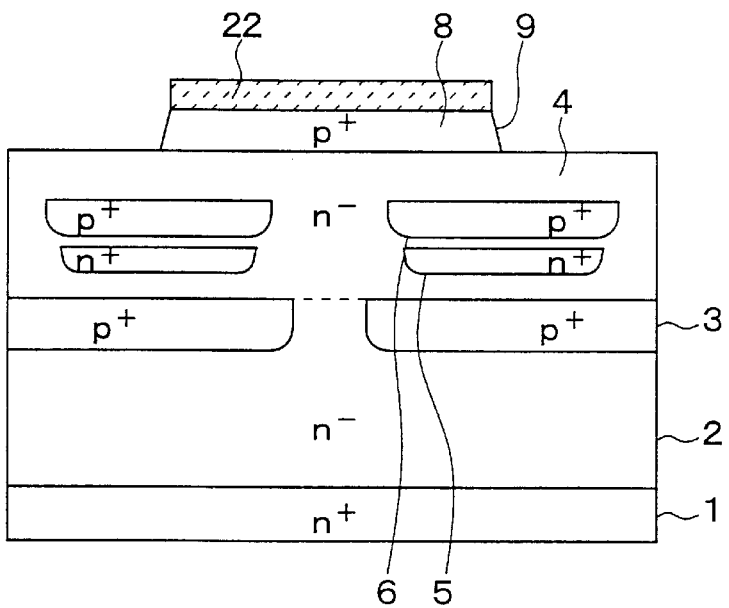
FIG. 6B is a cross sectional diagram showing a manufacturing process for the silicon carbide semiconductor device that follows FIG. 6A.

Step Shown in FIG. 6B

After forming an LTO film 22 on the third gate area 8, the LTO film 22 is patterned by photo lithography to open holes at prescribed areas. Using the LTO film 22 as a mask, etching is performed to form grooves 9. Grooves 9, for example, should be deep enough to reach the surface of the channel layer 4.

Figure 7A:
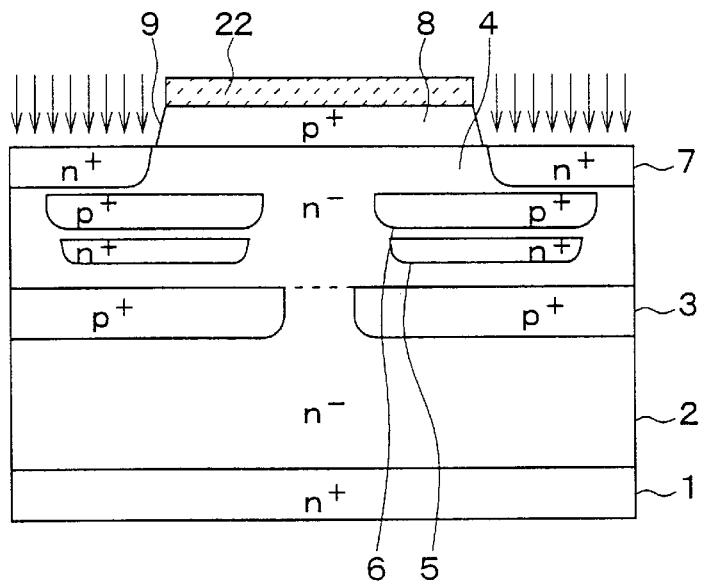
FIG. 7A is a cross sectional diagram showing a manufacturing process for the silicon carbide semiconductor device that follows FIG. 6.

Step Shown in FIG. 7A

Using the LTO film 22 as a mask, ion implanting is performed. More specifically, phosphorous or nitrogen is ion implanted as an n-type impurity at positions where the n⁺-type source areas 7 are to be formed.

Figure 7B:
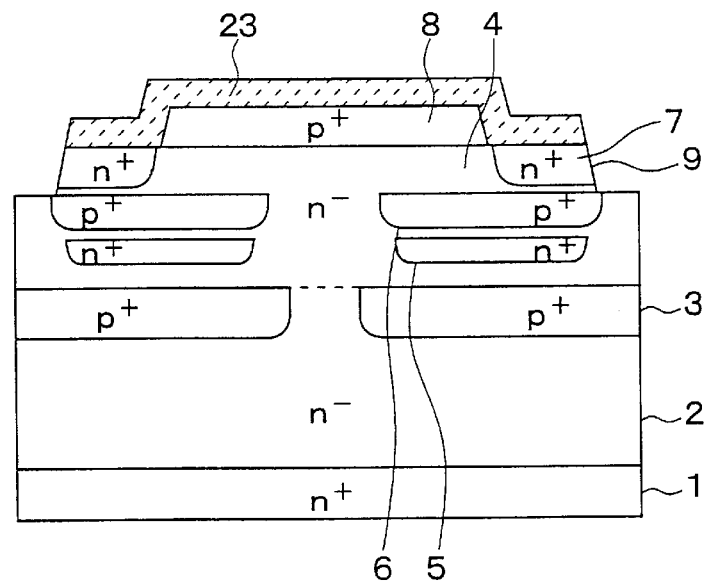
FIG. 7B is a cross sectional diagram showing a manufacturing process for the silicon carbide semiconductor device that follows FIG. 7A.

Step Shown in FIG. 7B

After growing an LTO film 23 over the third gate area 8 and n⁺-type source area 7, the LTO film 23 is patterned by photo lithography to open holes at prescribed areas. Etching is performed using the LTO film 23 as a mask to make the grooves 9 deep enough to reach the second gate areas 6.

Figure 8A:
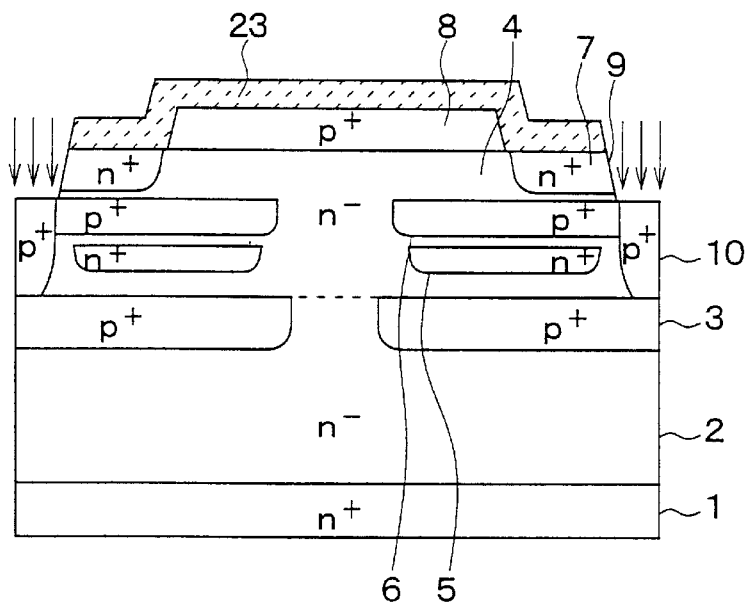
FIG. 8A is a cross sectional diagram showing a manufacturing process for the silicon carbide semiconductor device that follows FIG. 7.

Step Shown in FIG. 8A

Ion implanting is performed using the LTO film 23 as a mask. More specifically, aluminum or nitrogen is ion implanted as a p-type impurity at areas where the contact areas 10 are to be formed.

Figure 8B:
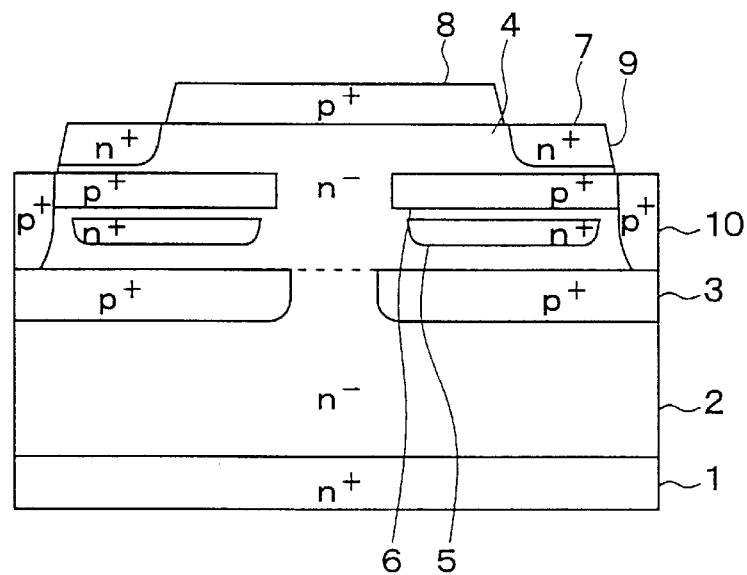
FIG. 8B is a cross sectional diagram showing a manufacturing process for the silicon carbide semiconductor device that follows FIG. 8A.

Step Shown in FIG. 8B

After the LTO film 23 is stripped, implanted ions are activated by an anneal treatment in a furnace or by rapid thermal annealing to form the contact areas 10. In order to prevent the p-type impurities from diffusing too much as the contact areas 10 are formed, either aluminum, which does not diffuse easily, or an appropriate ratio of boron and carbon (preferably 1:10 for boron:carbon) should be implanted in the step shown in FIG. 8A to prevent excessive thermal diffusion.

In the steps described so far, each impurity was activated one at a time. It is also possible to activate all impurities at once in the step shown in FIG. 8B. This will simplify the manufacturing process. It is also possible to activate two or more implanted impurities simultaneously to simplify the manufacturing process, without activating all impurities at once in this step.

The steps that would follow are not shown in the figures but would include a step for forming the interlayer dielectric film 13 on the substrate surface, and a step for forming the contact holes that connect the third gate area 8 and the n⁺-type source areas 7 by patterning the interlayer dielectric film 13. Then, an electrode layer is deposited on the interlayer dielectric film 13, and the electrode layer is patterned to form the source electrodes 11 and the gate electrode 12. Finally, the drain electrode 14 is formed on the substrate backside to complete the J-FET shown in FIG. 1.

Second Embodiment

Figure 9:
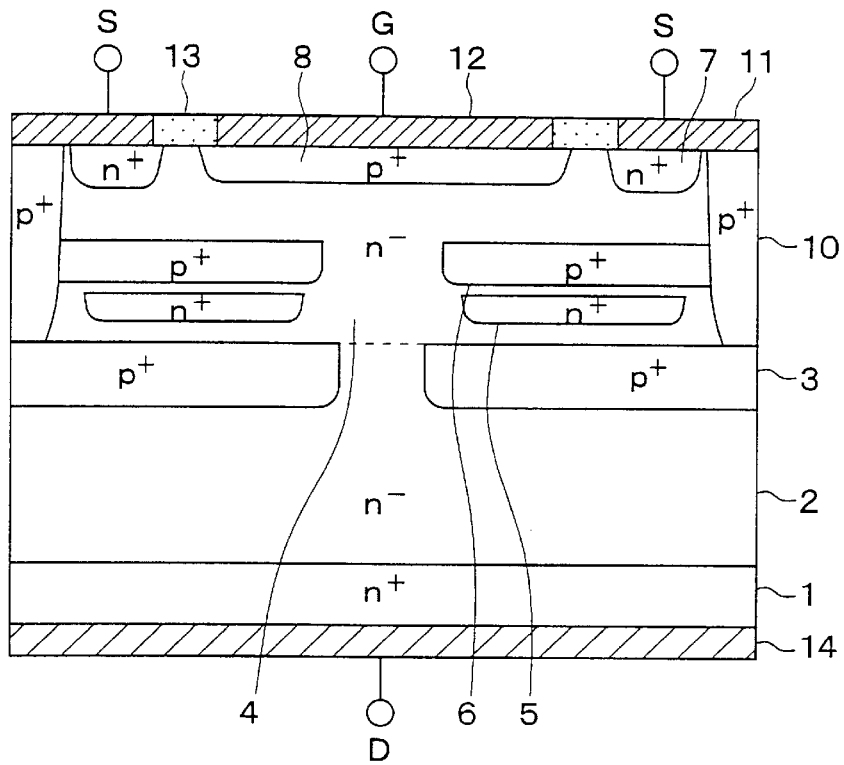
FIG. 9 is a cross sectional diagram showing the silicon carbide semiconductor device of the second embodiment of the present invention.

FIG. 9 shows a cross-sectional view of the silicon carbide semiconductor device in the second embodiment of the present invention. While the third gate area 8 was formed by epitaxial growth in the first embodiment, it is also possible to form the third gate area 8 by ion implanting p-type impurities into the channel layer 4, as shown in FIG. 9. Furthermore, while the grooves 9 are first formed and contact areas 10 are then formed at the bottom of the grooves 9 in the first embodiment, it is also possible to form the contact areas 10 directly on the surface of the channel layer 4 as shown in FIG. 9. The silicon carbide semiconductor device of this structure would also operate in the same way as the device in the first embodiment and provide similar effects as the device in the first embodiment.

Furthermore, the silicon carbide semiconductor device of such a structure can be manufactured by ion implanting p-type impurities in areas where the contact areas 10 are to be formed when p-type impurities are ion implanted at an area where the third gate area 8 is to be formed in the step shown in FIG. 4A.

Third Embodiment

Figure 10:
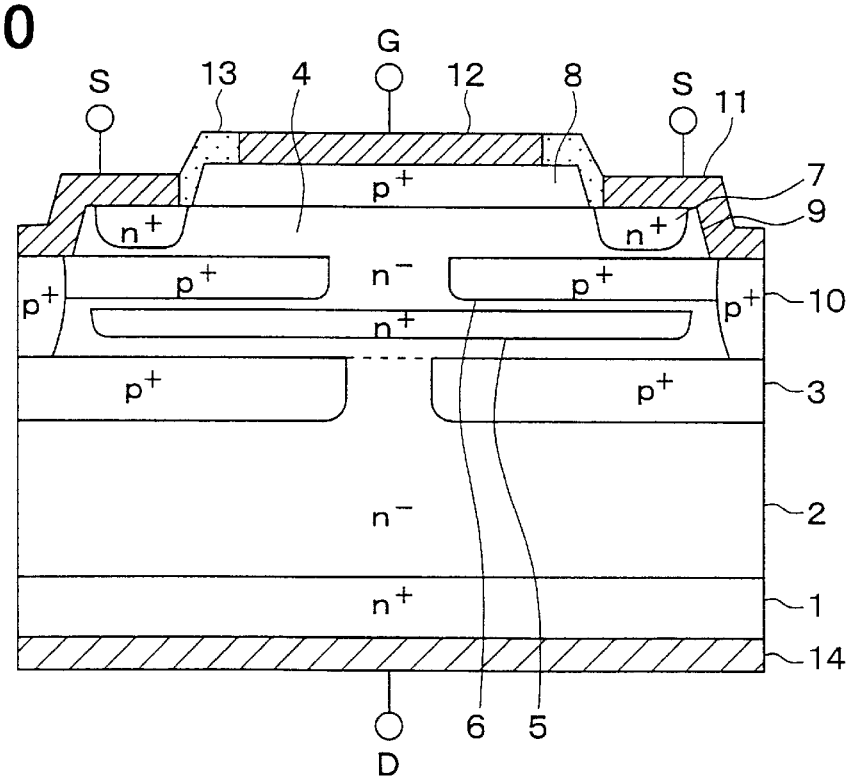
FIG. 10 is a cross sectional diagram showing the silicon carbide semiconductor device of the third embodiment of the present invention.

FIG. 10 shows a cross-sectional view of the silicon carbide semiconductor device of the third embodiment of the present invention. While the field enhanced areas 5 in FIG. 1 are placed to the right and left of the device in isolation from each other in the first embodiment, it is also possible, as shown in FIG. 10, to have the field enhanced areas 5 connected with each other, so that the field enhanced area 5 would stretch across an area of resistance in the J-FET.

Such a layout would make it possible to reduce the J-FET resistance and further reduce the on-resistance of the silicon carbide semiconductor device.

Fourth Embodiment

Figure 11:
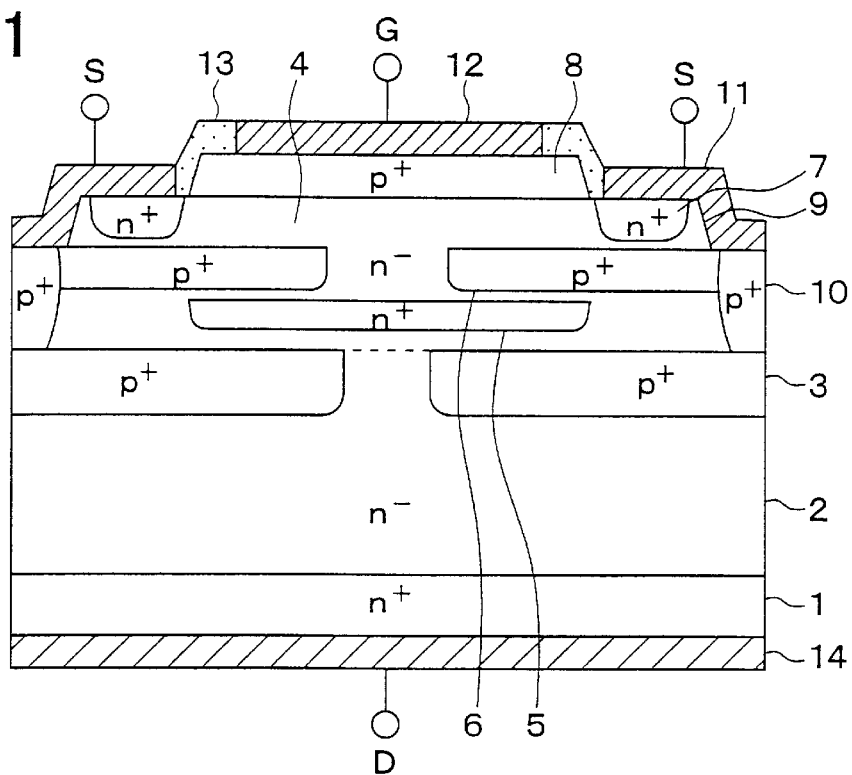
FIG. 11 is a cross sectional diagram showing the silicon carbide semiconductor device of the fourth embodiment of the present invention.

FIG. 11 shows a cross-sectional view of the silicon carbide semiconductor device in the fourth embodiment of the present invention. While the field enhanced area 5 is placed near the contact areas 10 to the right and left of the device in the third embodiment, it is also possible to have more space between the field enhanced area 5 and the contact areas 10, as shown in FIG. 11. Such a device structure would also yield similar effects as the device in the third embodiment. However, it is still necessary to have the field enhanced area 5 be placed between the first gate areas 3 and the second gate areas 6.

Fifth Embodiment

Figure 12:
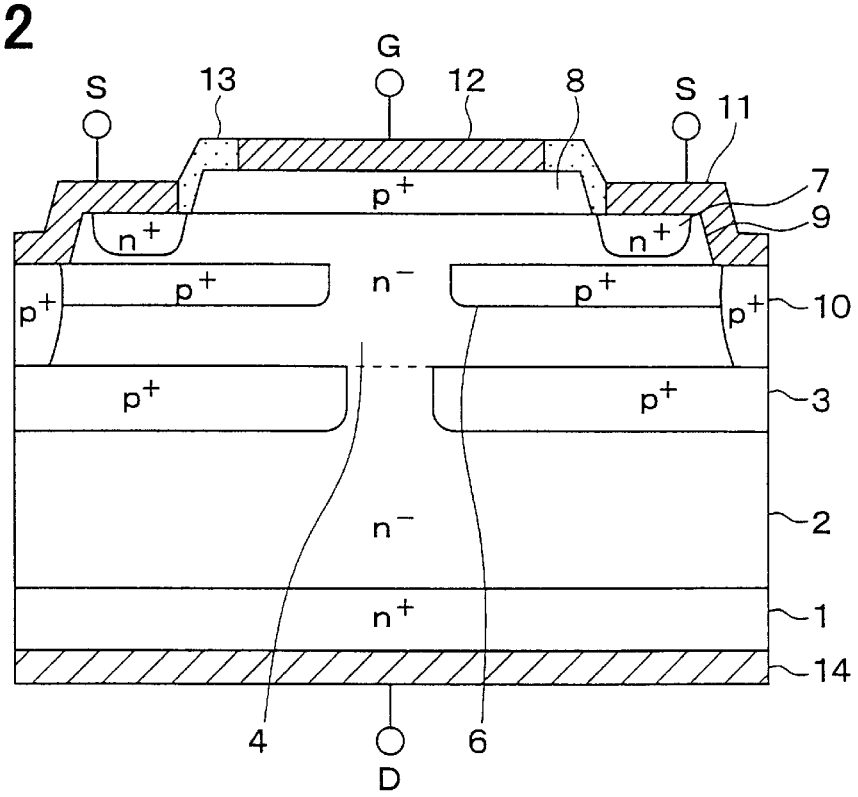
FIG. 12 is a cross sectional diagram showing the silicon carbide semiconductor device of the fifth embodiment of the present invention.

FIG. 12 shows a cross-sectional view of the silicon carbide semiconductor device in the fifth embodiment of the present invention. As shown in FIG. 12, in this embodiment the field enhanced areas 5 in the device of the first embodiment are eliminated, and an area between the first gate areas 3 and second gate areas 6 inside the channel layer 4 has a higher level of impurity concentration than other parts (for example, an area that makes up the channel of the second J-FET).

Even with this structure, the area of high level of impurity concentration between the first gate areas 3 and the second gate areas 6 in the channel layer 4 would function similarly to the field enhanced areas 5 to yield similar effects as the device in the first embodiment.

Sixth Embodiment

Figure 13:
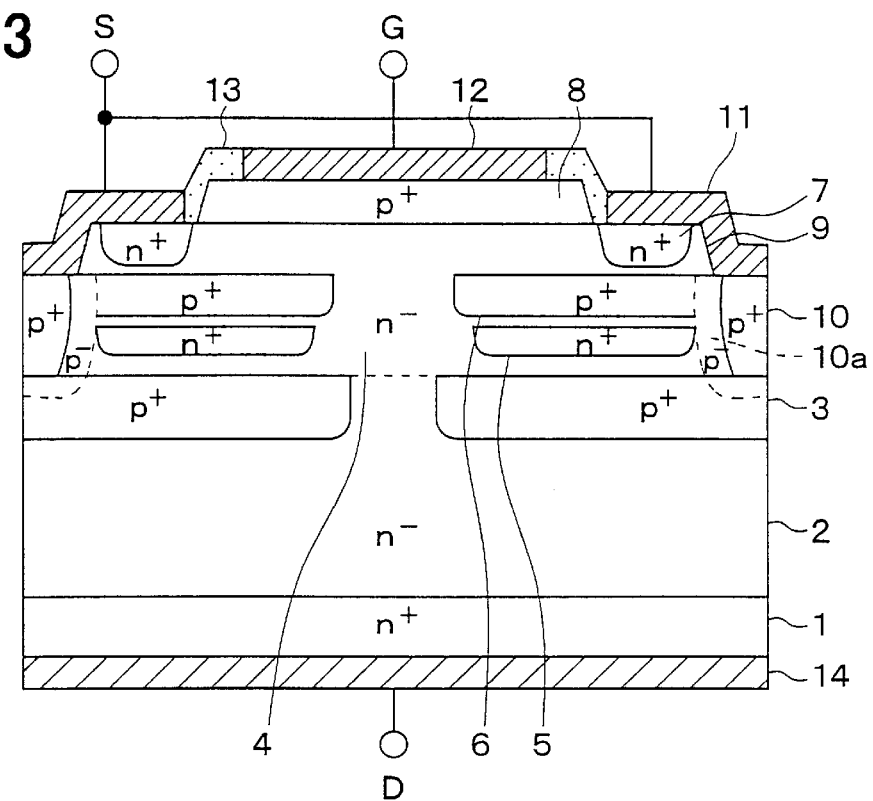
FIG. 13 is a cross sectional diagram showing the silicon carbide semiconductor device of the sixth embodiment of the present invention.

FIG. 13 shows a cross-sectional view of the silicon carbide semiconductor device of the sixth embodiment of the present invention. As shown in FIG. 13, the device in this embodiment includes low impurity concentration contact areas 10a, formed by diffusion from the contact areas 10 during a thermal treatment. This device structure is different from the device in the first embodiment in that the second gate areas 6 are electrically connected to the source electrodes 11 through these low impurity concentration contact areas 10a.

It is possible to obtain a silicon carbide semiconductor device offering similar effects as the device in the first embodiment by forming the low impurity concentration contact areas 10a by diffusion from the contact areas 10.

On the other hand, low impurity concentration contact areas 10a and field enhanced areas 5 can come into contact sometimes. Even in such instances, the PN junction can resist voltage because the low impurity concentration contact areas 10a is placed between the PN junction made of the p$^+$-type contact areas 10 and the n$^+$-type field enhanced areas 5.

As far as the method of manufacturing the silicon carbide semiconductor device in this embodiment, only a step for thermal diffusion needs to be added after ion implanting in the first embodiment for forming the contact areas 10. Other manufacturing steps remain the same as the first embodiment.

In the first embodiment, the second gate areas 6 are in contact with the contact areas 10 but not in contact with the field enhanced areas 5. Different masks are used for the second gate areas 6 and the field enhanced areas 5, so that the field enhanced areas 5 would be further away from the contact areas 10 than the second gate areas 6 are. With the device structure in the present embodiment, however, it is not necessary to have the field enhanced areas 5 be further away from the contact areas 10 than the second gate areas 6 are. Therefore, it is possible to use the same mask for forming both the second gate areas 6 and the field enhanced areas 5.

Seventh Embodiment

Figure 14:
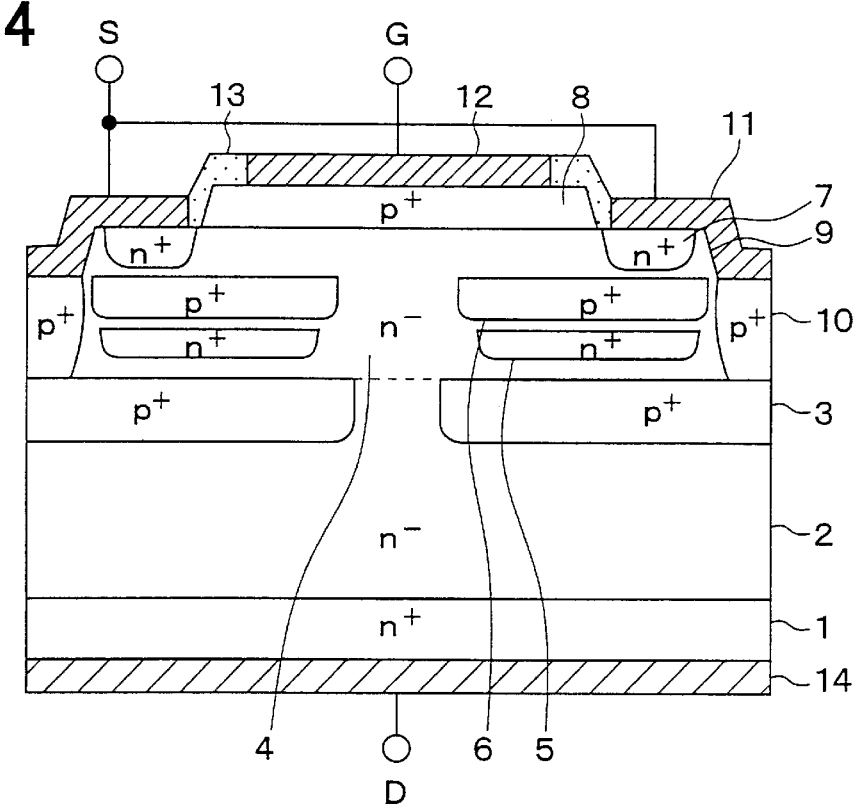
FIG. 14 is a cross sectional diagram showing the silicon carbide semiconductor device of the seventh embodiment of the present invention.

FIG. 14 shows a cross-sectional view of the silicon carbide semiconductor device in the seventh embodiment of the present invention. As shown in FIG. 14, this embodiment differs from the first embodiment in that the second gate areas 6 are isolated from the contact areas 10, and the second gate areas 6 are in a floating state. Because the second gate areas 6 are floating, it is possible to have the depletion layers also extend from the second gate areas 6 to further improve resistance to voltage.

Although the second gate areas 6 may be in a floating state, the second gate areas 6 may also be at the same potential as the third gate area 8. For example, it is possible to have the second gate areas 6 extend to the outside of the cell and be in contact with the third gate area 8. With such a structure, it would be possible to drive the second gate areas 6 at the same time as the third gate area 8 and simultaneously shrink the depletion layers extending from the areas 6 and 8 to further reduce the on resistance.

Whether, as described above, the second gate areas are in the floating state or at the same potential as the third gate area 8, the silicon carbide semiconductor device can be manufactured using the same method as the first embodiment. However, because the second gate areas 6 and the contact areas 10 are not in contact in the present embodiment, the same mask can be used for forming both the second gate areas 6 and the field enhanced areas 5.

Eighth Embodiment

Figure 15:
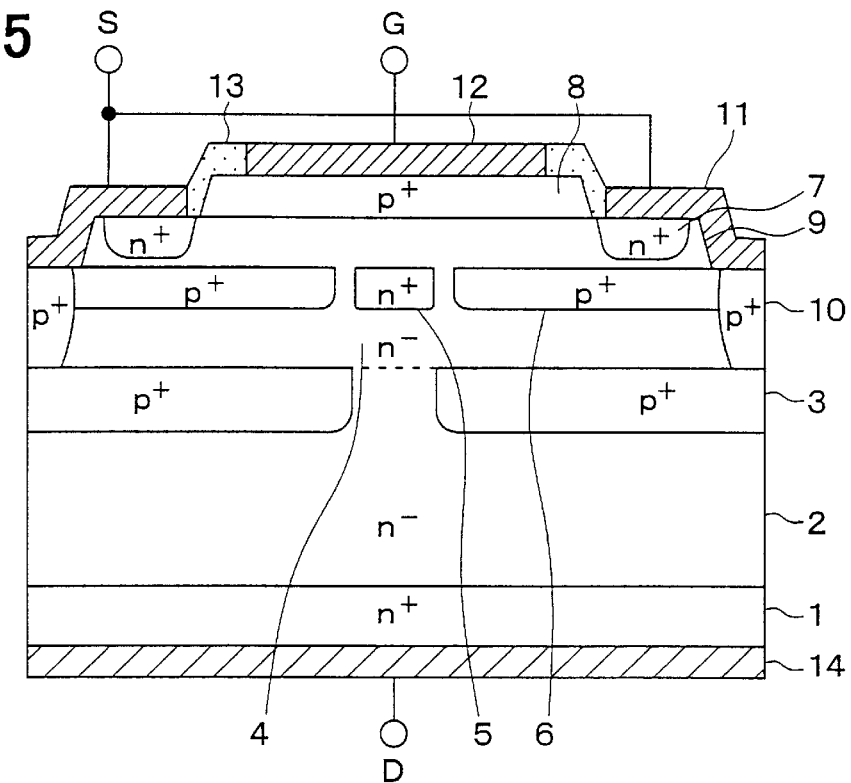
FIG. 15 is a cross sectional diagram showing the silicon carbide semiconductor device of the eighth embodiment of the present invention.

FIG. 15 shows a cross-sectional view of the silicon carbide semiconductor device of the eighth embodiment of the present invention. As shown in FIG. 15, the present embodiment differs from the first embodiment in that the field enhanced area 5 is placed between the neighboring second gate areas 6. Such a device structure would yield similar effects as the first embodiment, while reducing the J-FET resistance between the second gate areas 6 and reduce the on resistance.

The manufacturing method for the silicon carbide semiconductor device in the present embodiment is similar to the first embodiment, except that the mask patterns used for forming the field enhanced areas 5 in the first embodiment must be modified, and ion implanting conditions must also be modified.

Ninth Embodiment

Figure 16:
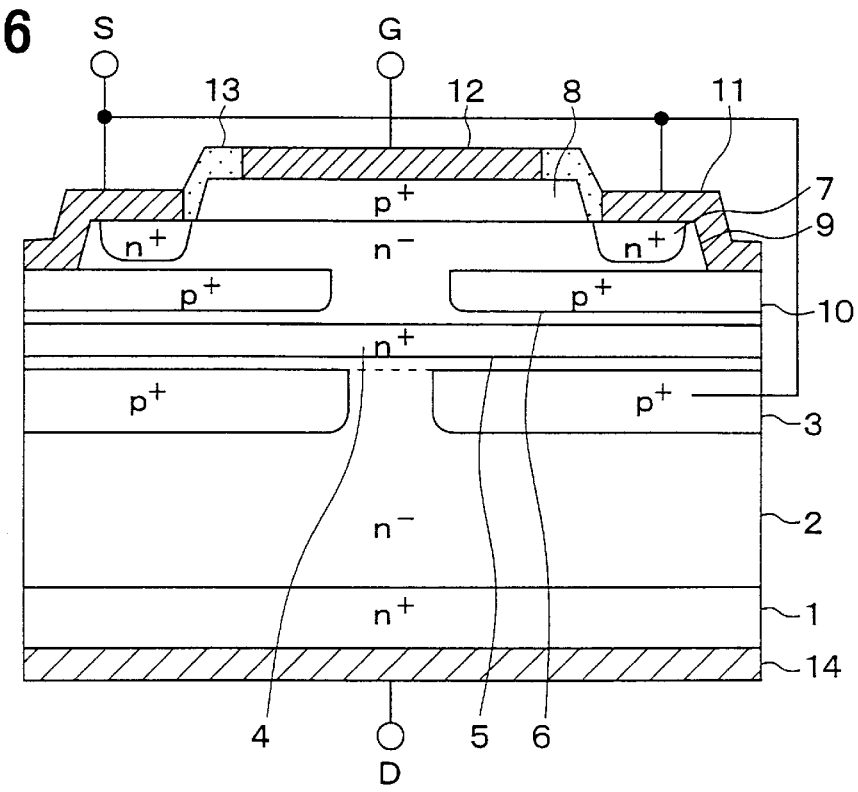
FIG. 16 is a cross sectional diagram showing the silicon carbide semiconductor device of the ninth embodiment of the present invention.

FIG. 16 shows a cross-sectional view of the silicon carbide semiconductor device in the ninth embodiment of the present invention. As shown in FIG. 16, the present embodiment differs from the first embodiment in that the field enhanced area 5 lays across the entire cell, and the first gate areas 3 are electrically connected to the source electrodes 11 at outside of the cell, instead of by the contact areas 10 shown in FIG. 1. This device structure offers similar effects as the first embodiment.

The method of manufacturing the silicon carbide semiconductor device in the present embodiment is similar to the first embodiment except that the step for forming the contact areas 10 is no longer needed. Similar to the first embodiment, the field enhanced area 5 may be formed by ion implanting. It is also possible to form the field enhanced area 5 by epitaxial growth.

Tenth Embodiment

Figure 17:
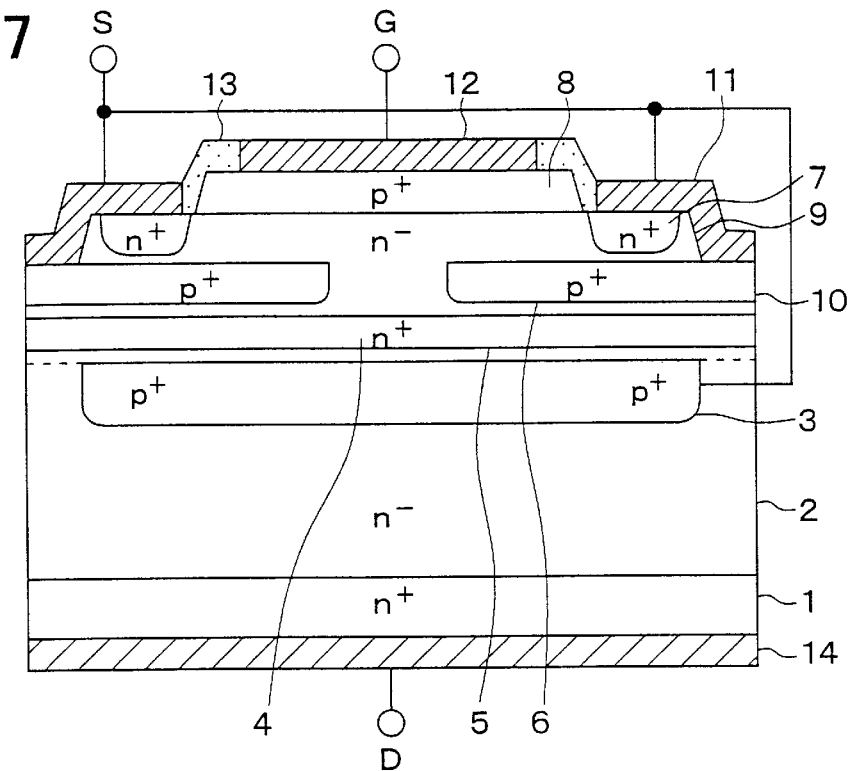
FIG. 17 is a cross sectional diagram showing the silicon carbide semiconductor device of the tenth embodiment of the present invention.

FIG. 17 shows a cross-sectional view of the silicon carbide semiconductor device in the tenth embodiment of the present invention. As shown in FIG. 17, in this embodiment, the first gate area 3 is formed differently compared with the ninth embodiment. More particularly, the first gate area 3 is placed to block the lower part of the J-FET area of the second J-FET, and the edges of the first gate area 3 are beneath the areas where the second gate areas 6 and the source electrodes 11 come into contact, making these areas act as a channel for the first J-FET.

In this device structure, (voltage) potential of the $n^-$-type epitaxial layer 2 extends toward the channel area of the second J-FET through a passage formed between the first gate area 3 and the second gate areas 6. Because the potential must travel across a larger distance before reaching the channel area of the second J-FET, the potential is less likely to directly hit the channel area of the second J-FET. As a result, voltage resistance improves.

With the device structure in the present embodiment, currents between the source and drain must also travel over a longer distance. However, impact on the on resistance would be negligible, because the field enhanced area 5 with a high level of impurity concentration is formed in the area where this distance would be longer compared with the ninth embodiment.

The method of manufacturing the silicon carbide semiconductor device in the present embodiment would be similar to the ninth embodiment except that the mask patterns for forming the first gate area 3 need to be modified.

Eleventh Embodiment

Figure 18:
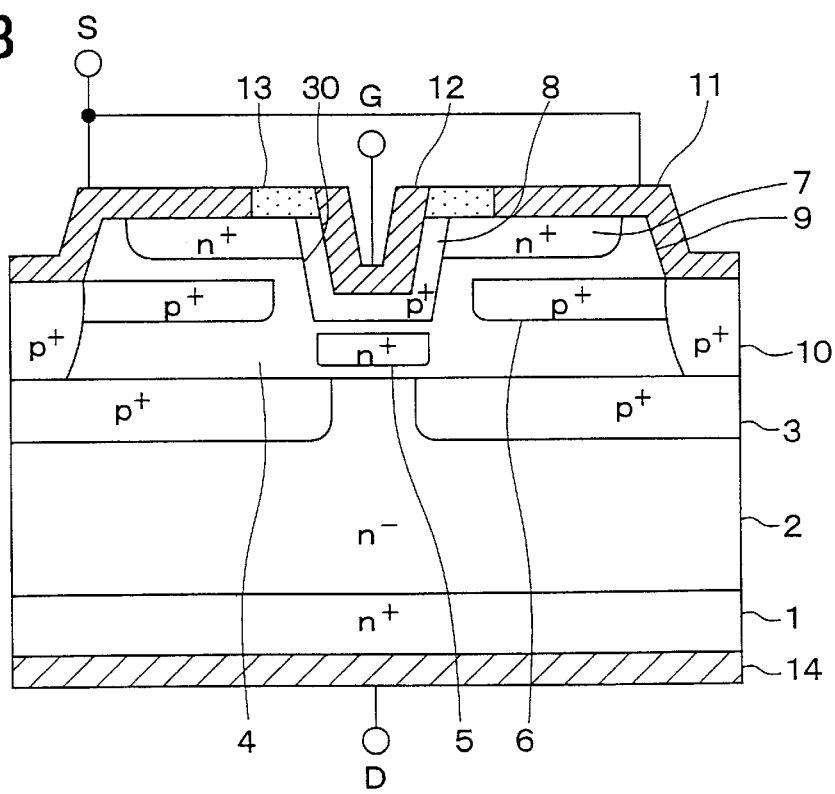
FIG. 18 is a cross sectional diagram showing the silicon carbide semiconductor device of the eleventh embodiment of the present invention.
Figure 19A:
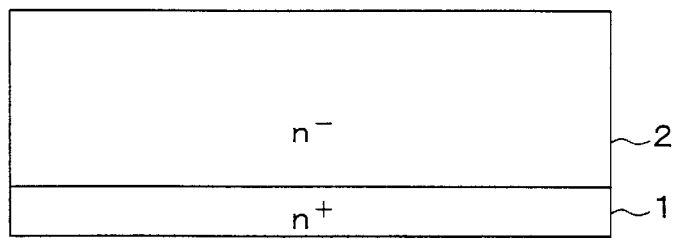
FIG. 19A is a cross sectional diagram showing a manufacturing process for the silicon carbide semiconductor device shown in FIG. 18.
Figure 19B:
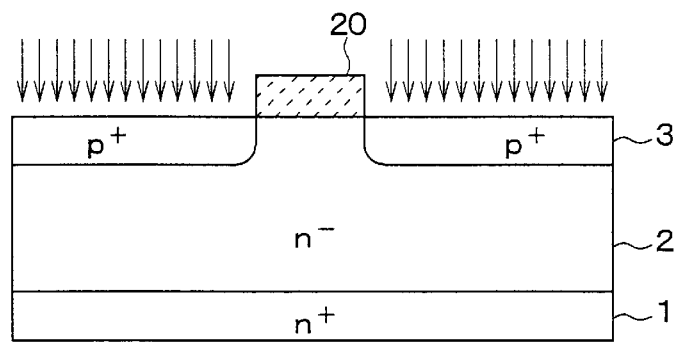
FIG. 19B is a cross sectional diagram showing a manufacturing process for the silicon carbide semiconductor device shown in FIG. 18.
Figure 20A:
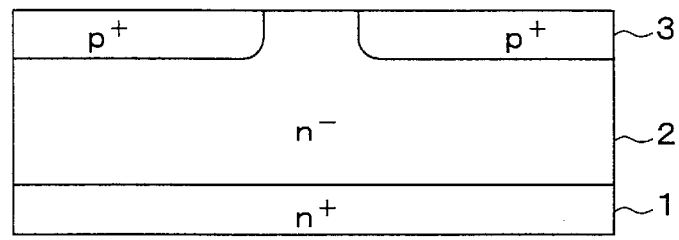
FIG. 20A is a cross sectional diagram showing a manufacturing process for the silicon carbide semiconductor device that follows FIG. 19.
Figure 20B:
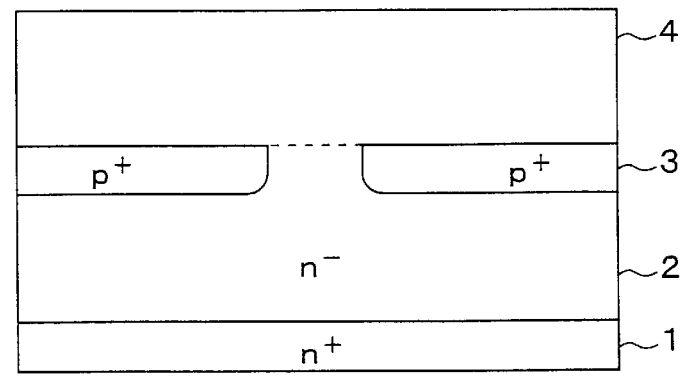
FIG. 20B is a cross sectional diagram showing a manufacturing process for the silicon carbide semiconductor device that follows FIG. 20A.

FIG. 18 shows a cross-sectional view of the silicon carbide semiconductor device in the eleventh embodiment of the present invention. In this embodiment, one of the embodiments of the present invention is applied to a silicon carbide semiconductor device having a trench single gate drive J-FET.

As shown in FIG. 18, a trench 30 is formed to penetrate between the $n^+$-type source areas 7 and reach the second gate areas 6, which are next to each other. The third gate area 8 is formed on the inner walls of the trench 30, and the gate electrode 12 is formed on the surface of the third gate area 8 inside the trench 30. The field enhanced area 5 is formed beneath the trench 30 in the channel layer 4. Other parts of the device structure are similar to the first embodiment.

A silicon carbide semiconductor device with this trench J-FET would operate similarly to the device in the first embodiment, providing similar effects.

The method of manufacturing the silicon carbide semiconductor device in FIG. 18 is shown in FIG. 19 through FIG. 24. The method of manufacturing the silicon carbide semiconductor device will be described using these figures. Parts of the method of manufacturing that are similar to the first embodiment, however, will not be described and will reference the FIG. 2 through FIG. 8.

The steps shown in FIG. 19A through FIG. 21A are similar to the steps shown in FIG. 2A through FIG. 4A for the first embodiment. After forming an $n^-$-type epitaxial layer 2 on an $n^+$-type substrate 1, the first gate areas 3 are formed at the surface of the $n^-$-type epitaxial layer 2, the channel layer 4 is formed at the surface of the $n^-$-type epitaxial layer 2, and the second gate areas 6 are formed at the middle-layer part of the channel layer 4. The steps shown in FIG. 21B then follow.

Figure 21A:
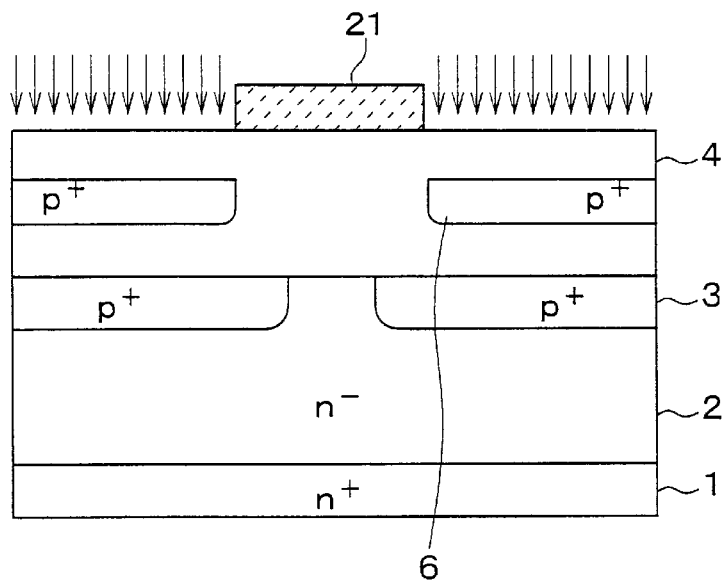
FIG. 21A is a cross sectional diagram showing a manufacturing process for the silicon carbide semiconductor device that follows FIG. 20.
Figure 21B:
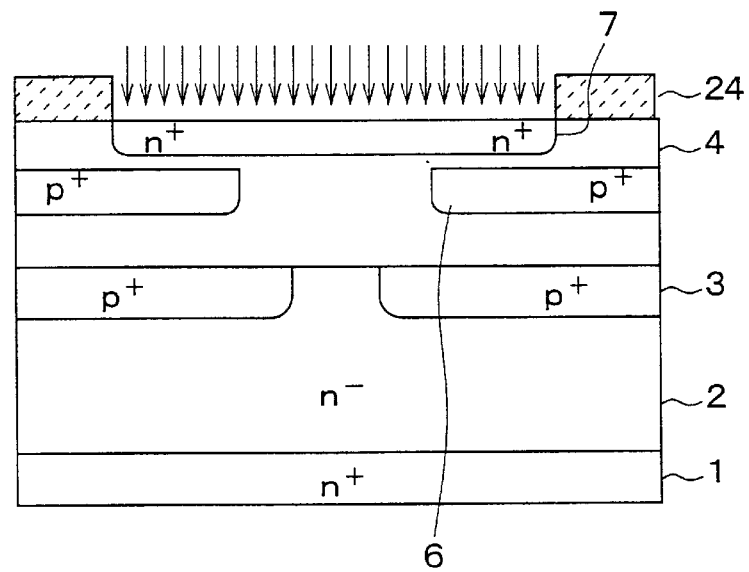
FIG. 21B is a cross sectional diagram showing a manufacturing process for the silicon carbide semiconductor device that follows FIG. 21A.

Steps Shown in FIG. 21B

After forming an LTO film 24 on the channel layer 4, the LTO film 24 is patterned by photo lithography to open holes at prescribed areas. Using the LTO film 24 as a mask, ion implanting is next performed. More specifically, phosphorous or a combination of phosphorous and nitrogen are ion implanted as an n-type impurity into areas where the $n^+$-type source areas 7 are to be formed.

The LTO film 24 is next stripped, and implanted ions are activated with an anneal treatment in a furnace or by rapid thermal annealing to form the $n^+$-type source areas 7.

Figure 22A:
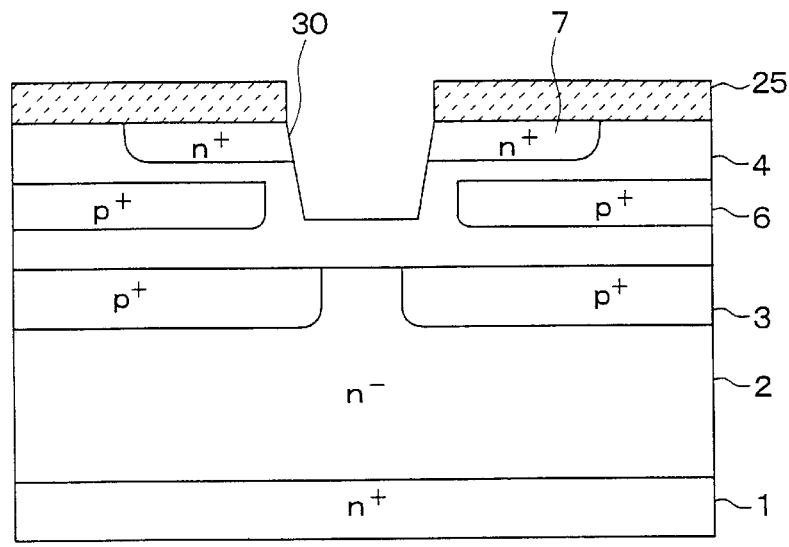
FIG. 22A is a cross sectional diagram showing a manufacturing process for the silicon carbide semiconductor device that follows FIG. 21.

Steps Shown in FIG. 22A

An LTO film 25 is formed on top of the channel layer 4 to also cover the $n^+$-type source areas 7. The LTO film 25 is patterned by photo lithography to open holes at prescribed areas. Etching is performed using the LTO film 25 as a mask. Trench 30 is thus formed to penetrate between the $n^+$-type source areas 7, reach down to the depth of the second gate areas 6, and wedge between the neighboring second gate areas 6.

Figure 22B:
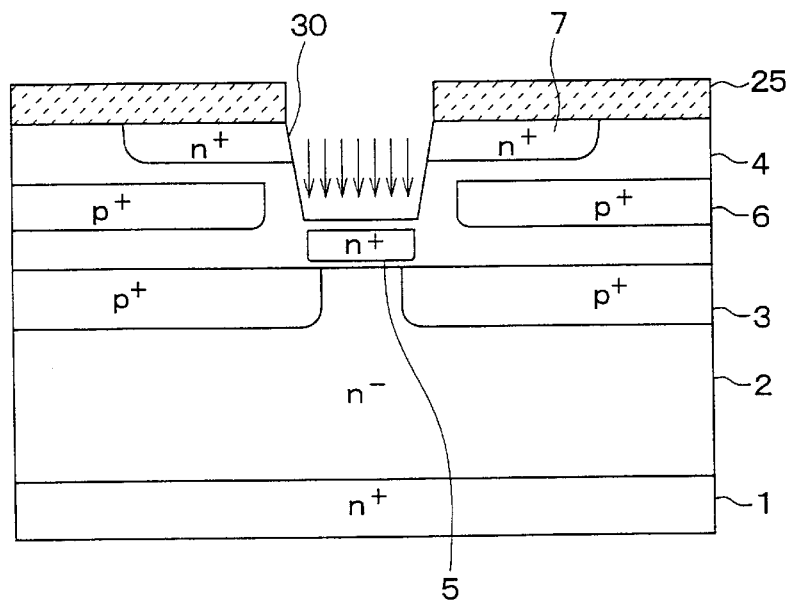
FIG. 22B is a cross sectional diagram showing a manufacturing process for the silicon carbide semiconductor device that follows FIG. 22A.

Steps Shown in FIG. 22B

Next, the LTO film 25 is used again as a mask for ion implanting to implant phosphorous or a combination of phosphorous and nitrogen as an n-type impurity into an area below the trench 30 in the channel layer 4. Next, the LTO film 25 is stripped, and implanted ions are activated with an anneal treatment in a furnace or by rapid thermal annealing to form the field enhanced area 5.

Figure 23A:
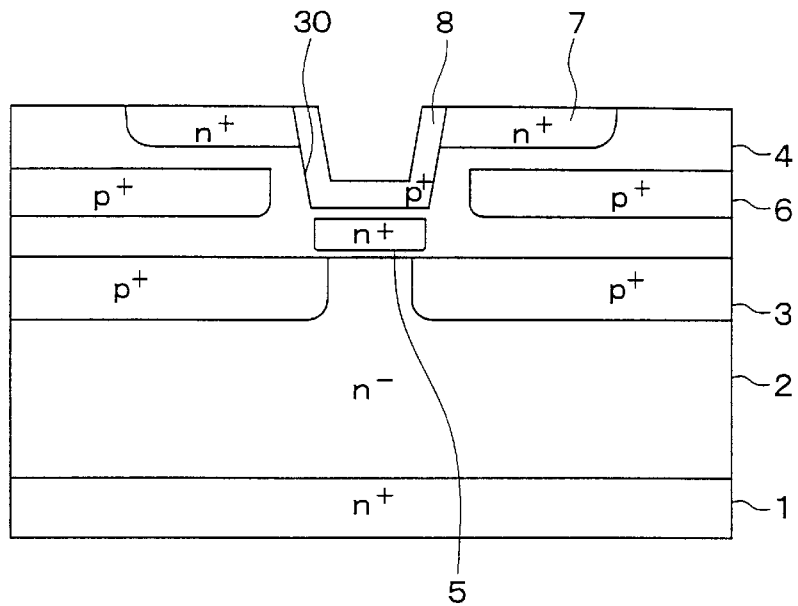
FIG. 23A is a cross sectional diagram showing a manufacturing process for the silicon carbide semiconductor device that follows FIG. 22.

Steps Shown in FIG. 23A

After forming a $p^+$-type layer by epitaxial growth inside the trench 30 and on the channel layer 4, the surface of this film is planarized by chemical mechanical polishing to leave the third gate area 8 behind in the trench 30. Although the third gate area 8 is grown epitaxially in this step, it is also possible to form this area by ion implanting.

Figure 23B:
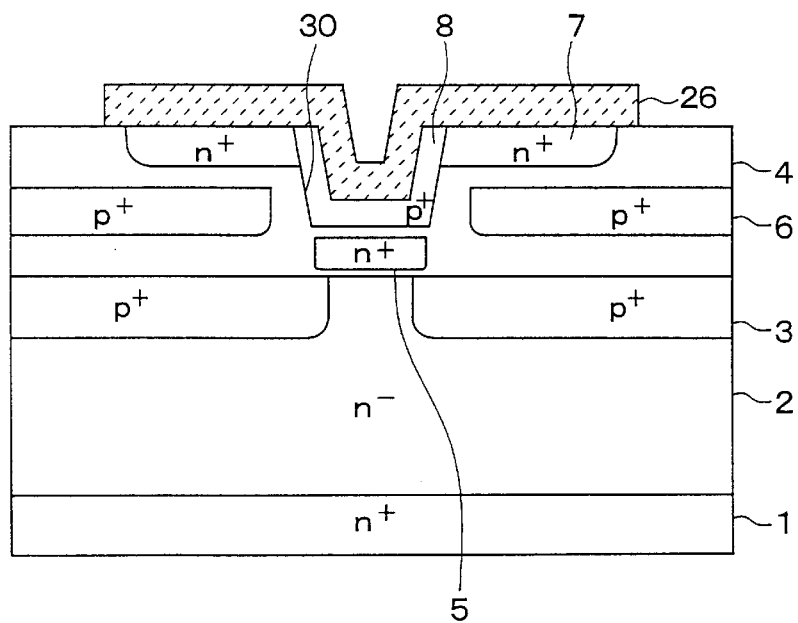
FIG. 23B is a cross sectional diagram showing a manufacturing process for the silicon carbide semiconductor device that follows FIG. 23A.

Steps Shown in FIG. 23B

An LTO film 26 is formed over the third gate area 8 and the channel layer 4. The LTO film 26 is then patterned by photo lithography to open holes at prescribed areas. Next, grooves 9, reaching down to the second gate areas 6, are formed by etching using the LTO film 26 as a mask.

Figure 24A:
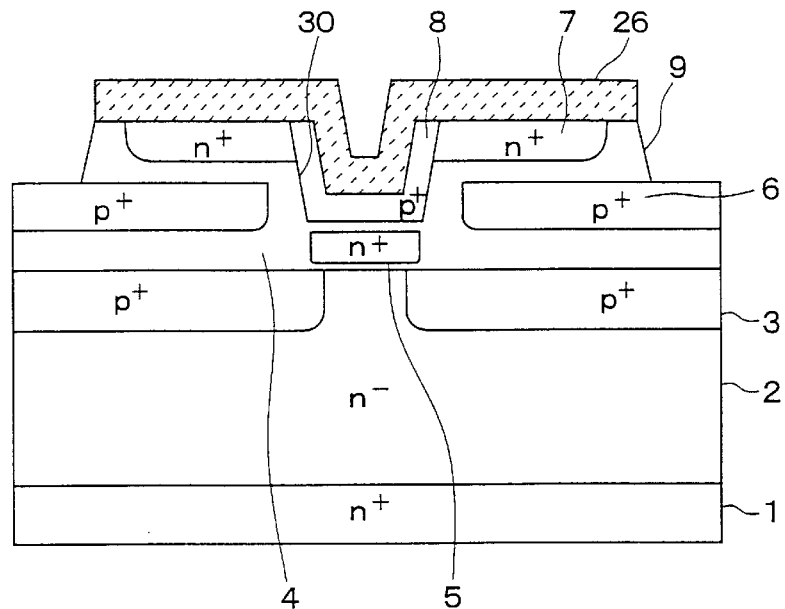
FIG. 24A is a cross sectional diagram showing a manufacturing process for the silicon carbide semiconductor device that follows FIG. 23.
Figure 24B:
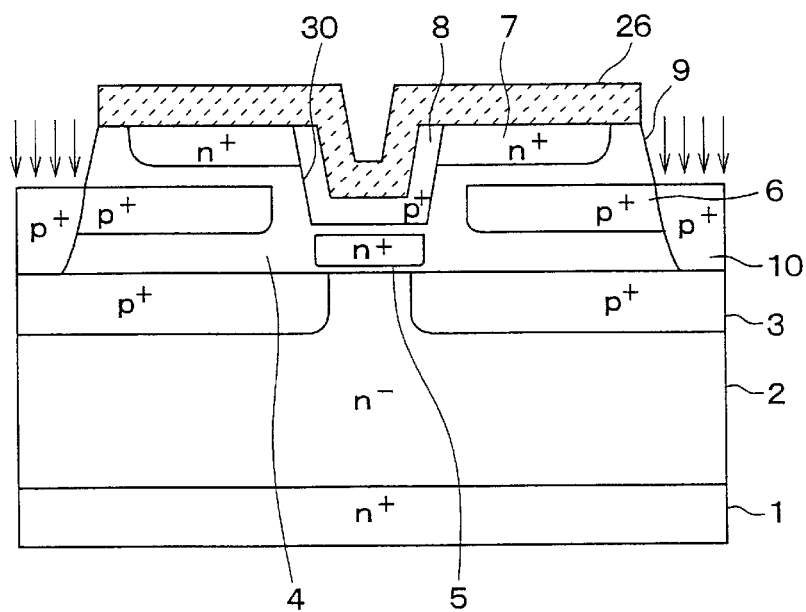
FIG. 24B is a cross sectional diagram showing a manufacturing process for the silicon carbide semiconductor device that follows FIG. 24A.

Steps Shown in FIG. 24A

Using the LTO film 26 as a mask again, boron (B) or aluminum (Al) is ion implanted as a p-type impurity to penetrate through the channel layer 4 at the bottom surface of the grooves 9 and deep enough to reach surface of the first gate areas 3. Then, after the LTO film 26 is stripped, contact areas 10 are formed by activating the implanted ions with an anneal treatment in a furnace or by rapid thermal annealing.

If it is necessary to keep the p-type impurities from diffusing too much, as the contact areas 10 are formed, then either aluminum, which does not diffuse much, or an appropriate ratio of boron and carbon (preferably 1:10 for boron:carbon) should be implanted in this step to prevent too much diffusion.

The ensuing steps will not reference any figures. Firstly, an interlayer dielectric film 13 is deposited on the substrate surface, and the interlayer dielectric film 13 is patterned to form contact holes that connect to the third gate area 8 and the $n^+$-type source areas 7. After depositing an electrode layer on the interlayer dielectric film 13, the electrode layer is patterned to form the source electrodes 11 and gate electrode 12. Furthermore, the drain electrode 14 is formed on the backside of the substrate to complete the J-FET structure shown in FIG. 1.

Twelfth Embodiment

Figure 25:
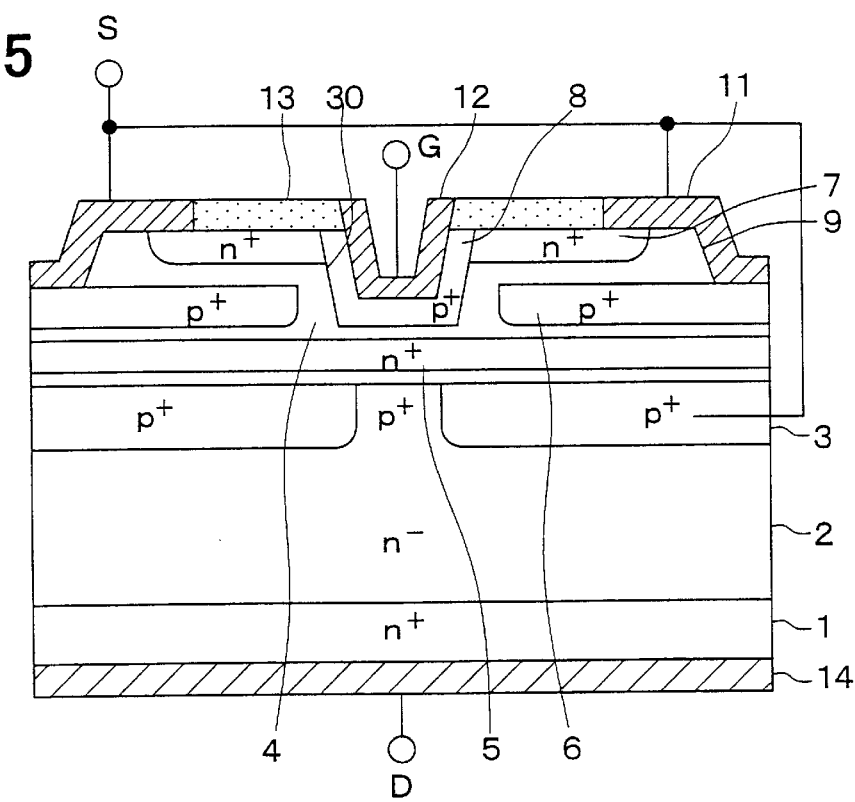
FIG. 25 is a cross sectional diagram showing the silicon carbide semiconductor device of the twelfth embodiment of the present invention.

FIG. 25 shows a cross-sectional view of the silicon carbide semiconductor device in the twelfth embodiment of the present invention. The device structure in this embodiment combines the trench J-FET in the eleventh embodiment and the structure of the field enhanced area 5 in the ninth embodiment. Such a device structure would yield similar effects as the eleventh embodiment.

A method of manufacturing the silicon carbide semiconductor device in this embodiment is similar to the eleventh embodiment except for the step for forming the contact areas 10, which is eliminated. The field enhanced area 5 may be formed by ion implanting as in the eleventh embodiment, but the field enhanced area 5 may also be formed by epitaxial growth.

Thirteenth Embodiment

Figure 26:
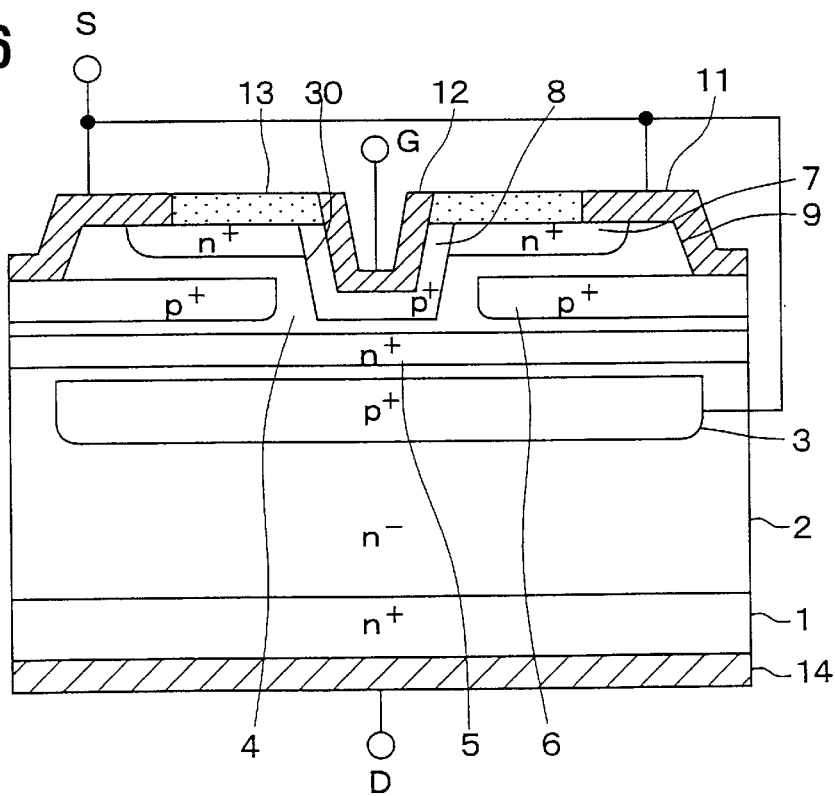
FIG. 26 is a cross sectional diagram showing the silicon carbide semiconductor device of the thirteenth embodiment of the present invention.

FIG. 26 shows a cross-sectional view of the silicon carbide semiconductor device in the thirteenth embodiment of the present invention. The device structure in this embodiment combines the trench J-FET in the eleventh embodiment and the layout of the first gate areas 3 in the tenth embodiment. With this structure, effects similar to the tenth embodiment are achieved with the trench J-FET shown in the eleventh embodiment.

A method of manufacturing the silicon carbide semiconductor device of the present embodiment is similar to the eleventh embodiment except that the mask patterns for forming the first gate area 3 need to be modified.

Fourteenth Embodiment

Figure 27:
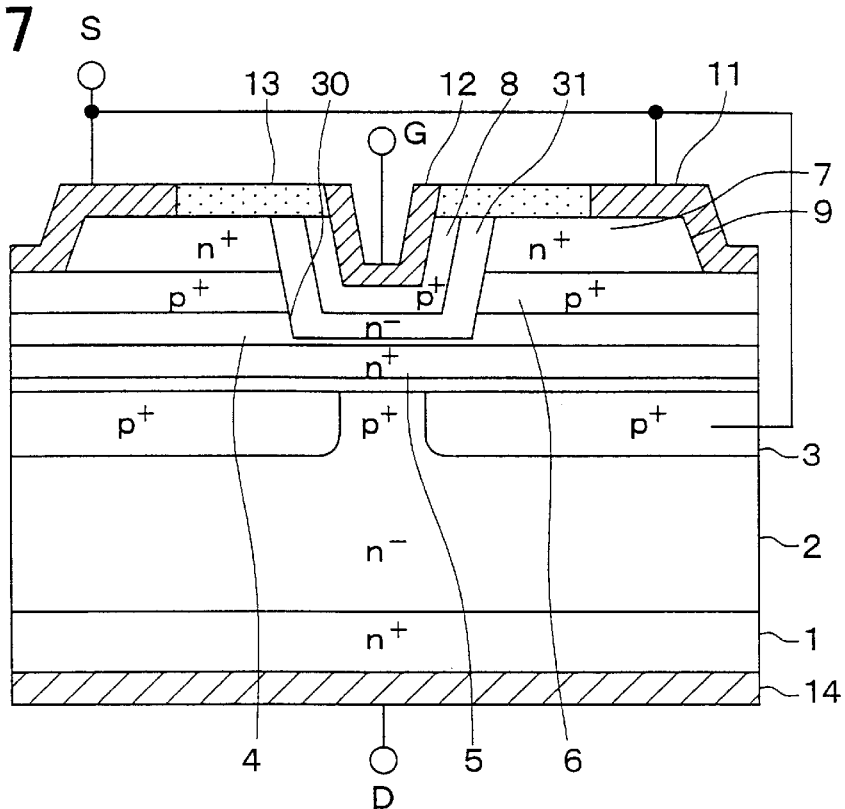
FIG. 27 is a cross sectional diagram showing the silicon carbide semiconductor device of the fourteenth embodiment of the present invention.

FIG. 27 shows a cross-sectional view of the silicon carbide semiconductor device of the fourteenth embodiment of the present invention. In this embodiment, the second gate areas 6 of the trench J-FET, shown in the twelfth embodiment, are formed by epitaxial growth. In this silicon carbide semiconductor device, an n$^-$-type layer 31 is formed inside the trench, and the third gate area 8 is formed on top of this n$^-$-type layer 31.

In this device structure, the second J-FET operates with the n$^-$-type layer 31, positioned between the second and third gate areas 6 and 8, as a channel area, to yield similar effects as the device in the eleventh embodiment.

A method of manufacturing the silicon carbide semiconductor device of the present embodiment is similar to the twelfth embodiment. However, once the second gate areas 6 are grown epitaxially, the trench 30 is formed to penetrate between the second gate areas 6, the n$^-$-type layer 31 is formed inside this trench 30, and the third gate area 8 is then formed.

Fifteenth Embodiment

Figure 28:
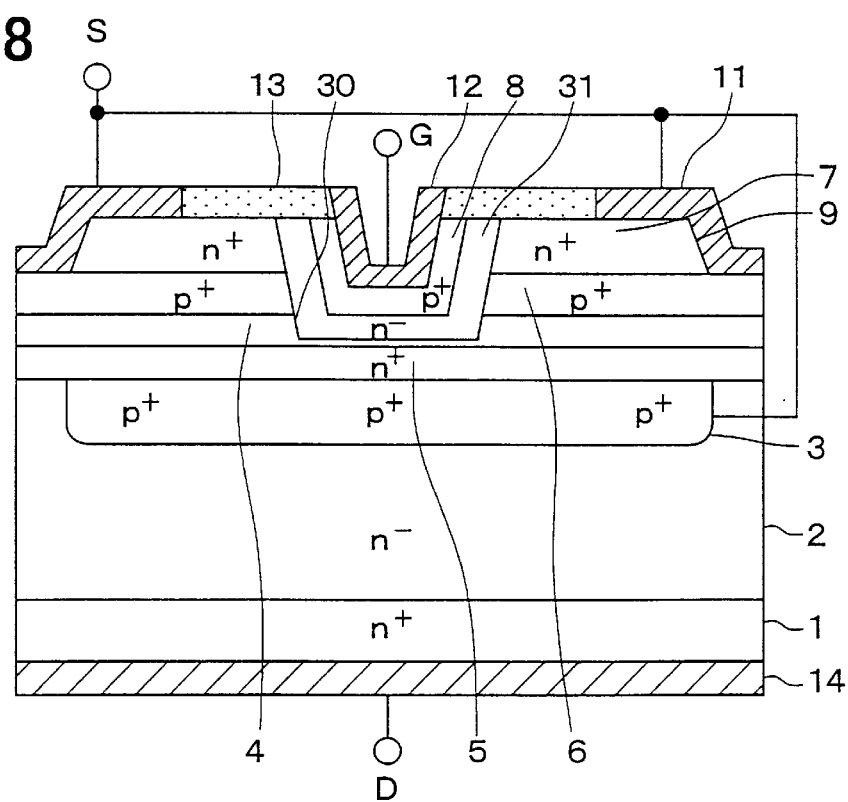
FIG. 28 is a cross sectional diagram showing the silicon carbide semiconductor device of the fifteenth embodiment of the present invention.

FIG. 28 shows a cross-sectional view of the silicon carbide semiconductor device of the fifteenth embodiment of the present invention. The device structure in this embodiment combines the trench J-FET of the fourteenth embodiment and the layout of the third gate area 3 of the tenth embodiment.

With this device structure, effects similar to the tenth embodiment are obtained with the trench J-FET in the fourteenth embodiment.

A method of manufacturing the silicon carbide semiconductor device of this embodiment is similar to the fourteenth embodiment, except that the mask patterns for forming the first gate areas 3 need to be modified.

Sixteenth Embodiment

Figure 29:
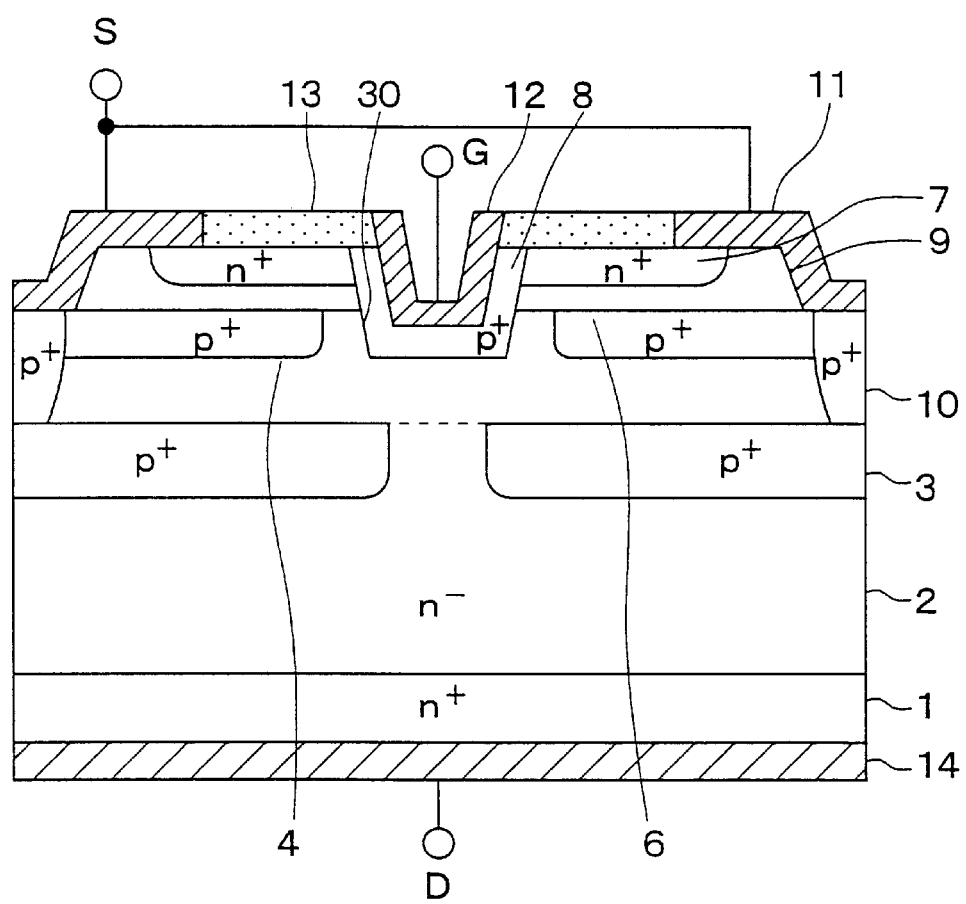
FIG. 29 is a cross sectional diagram showing the silicon carbide semiconductor device of the sixteenth embodiment of the present invention.

FIG. 29 shows a cross-sectional view of the silicon carbide semiconductor device of the sixteenth embodiment of the present invention. The device structure in this embodiment combines the trench J-FET in the eleventh embodiment with the structure in the fifth embodiment, in which the field enhanced areas 5 are eliminated, and instead the area in the channel layer 4 sandwiched between the first and second gate areas 3 and 6 has a higher level of impurity concentration than other areas.

This device structure would yield similar effects as the eleventh embodiment. A method of manufacturing the silicon carbide semiconductor device of this structure is similar to the eleventh embodiment, except that the step for forming the field enhanced areas 5, required in the eleventh embodiment, is eliminated.

In this structure, the area in the channel layer 4 is located between the first and second gate areas 3 and 6 has a higher level of impurity concentration than other parts. The impurity concentration in this part is determined by the distance between the adjacent first gate areas 3. The effects described above can also be obtained by adjusting this distance but having the same level of impurity concentration throughout the entire channel layer 4.

Seventeenth Embodiment

Figure 30:
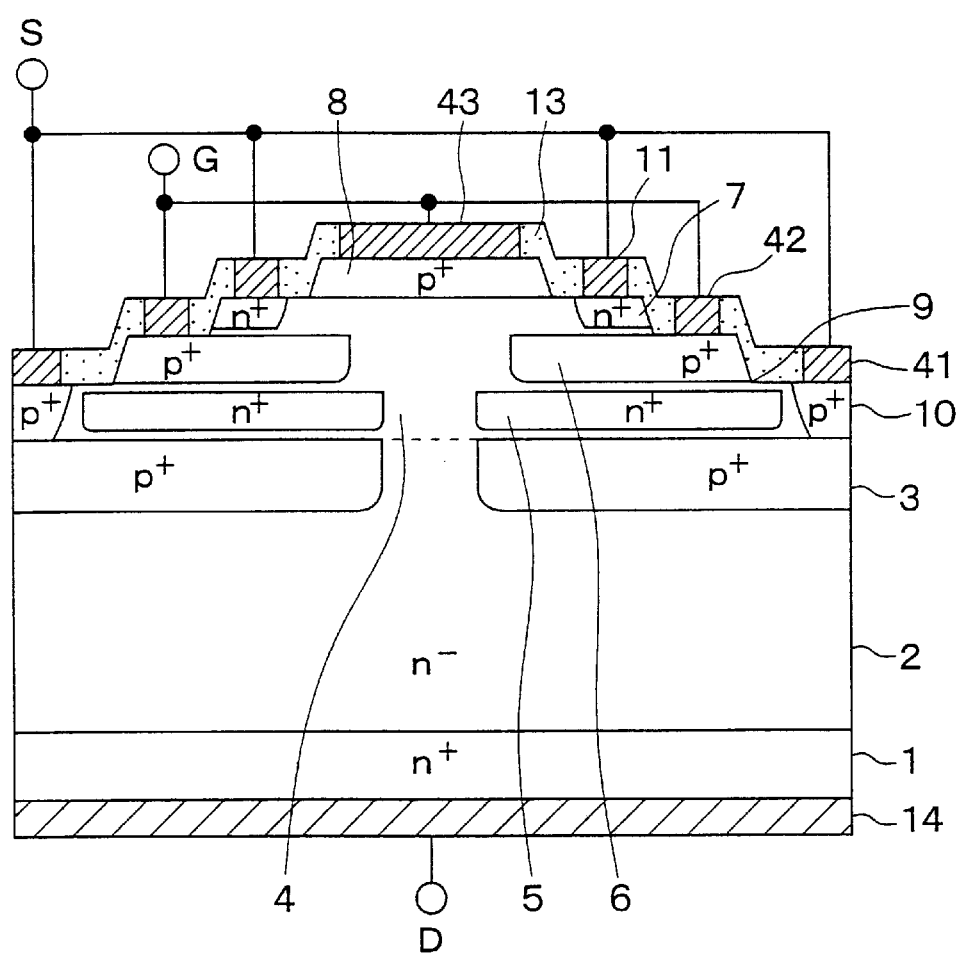
FIG. 30 is a cross sectional diagram showing the silicon carbide semiconductor device of the seventeenth embodiment of the present invention.

FIG. 30 shows a cross-sectional view of the silicon carbide semiconductor device in the seventeenth embodiment of the present invention. With this embodiment, one of the embodiments of the present invention is applied to a planar double-gate drive J-FET.

As shown in FIG. 30, the grooves 9 have steps, and grooves 9 penetrate through the second gate areas 6. Contact areas 10 are formed at the bottom of the grooves 9. In other words, contact areas 10 are isolated from the second gate areas 6, and only the first gate areas 3 are connected to the contact areas 10. First, second, and third gate electrodes 41, 42, 43, respectively, are connected separately to the first, second, and third gate areas 3, 6, 8, respectively. The first gate electrodes 41 are connected to the source electrodes 11 and ground, and the second gate electrodes 42 and third gate electrode 43 are connected together to simultaneously control the potential of the second and third gate areas 6 and 8. The structure of this device is otherwise similar to the first embodiment.

This device structure enables double-gate drive for controlling the extension of depletion layers from both the second and third gate areas 6 and 8 by applying a bias on the second and third gate areas 6 and 8. The silicon carbide semiconductor device having such a double-gate drive J-FET also provides similar effects as the first embodiment.

A method of manufacturing the silicon carbide semiconductor device of the present embodiment is similar to the first embodiment. After the step for forming the grooves 9 shown in the first embodiment, another mask is formed with prescribed patterns, followed by an etching step using that mask to have the grooves 9 penetrate through the second gate areas 6. Finally, contact areas 10 are formed.

Eighteenth Embodiment

Figure 31:
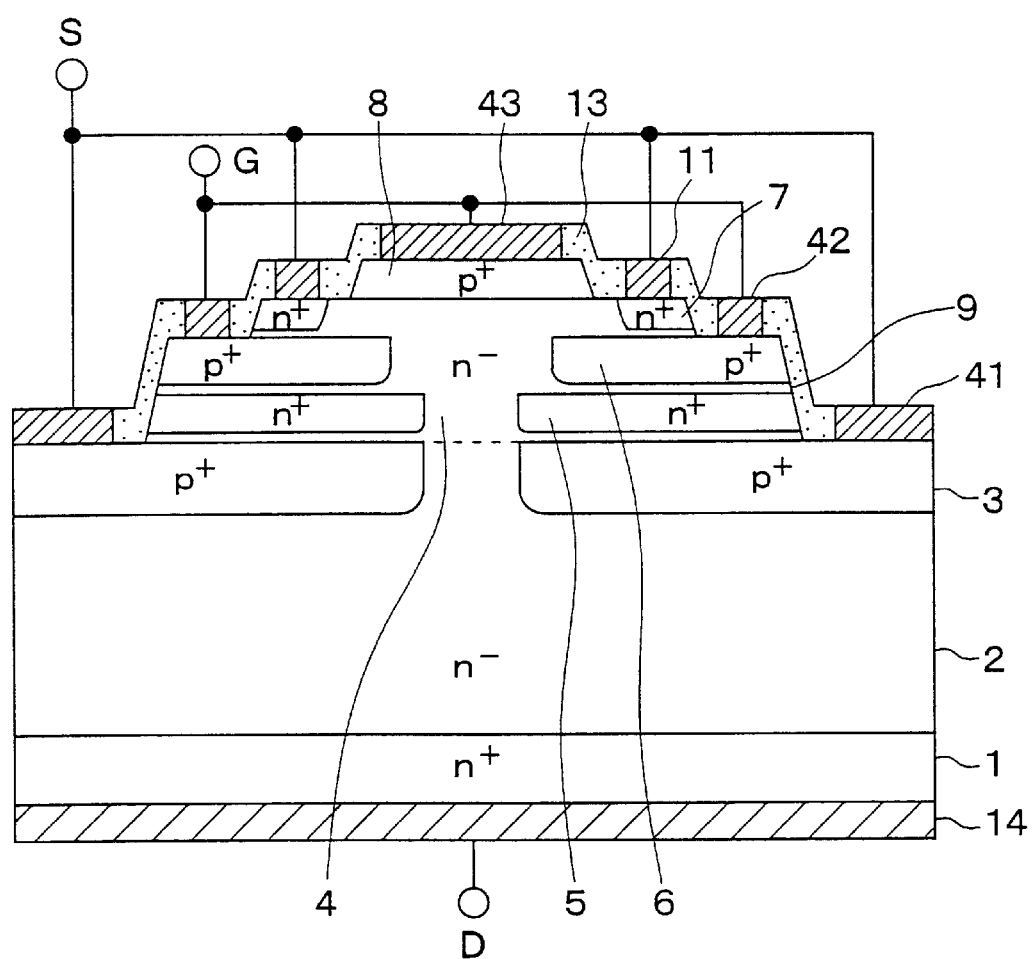
FIG. 31 is a cross sectional diagram showing the silicon carbide semiconductor device of the eighteenth embodiment of the present invention.

FIG. 31 shows a cross-sectional view of the silicon carbide semiconductor device of the eighteenth embodiment of the present invention. In this embodiment, grooves 9 are made even deeper than in the seventeenth embodiment, so that the first gate electrodes 41 would come into direct contact with the first gate areas 3, without the contact areas 10 shown in FIG. 30. This device structure yields similar effects as the device in the seventeenth embodiment.

A manufacturing method for this silicon carbide semiconductor device is similar to the seventeenth embodiment, except that the grooves 9 are etched deep enough to reach the first gate areas 3 during the etching step for the grooves 9, and the step for forming the contact areas 10, described earlier, is eliminated.

Nineteenth Embodiment

Figure 32:
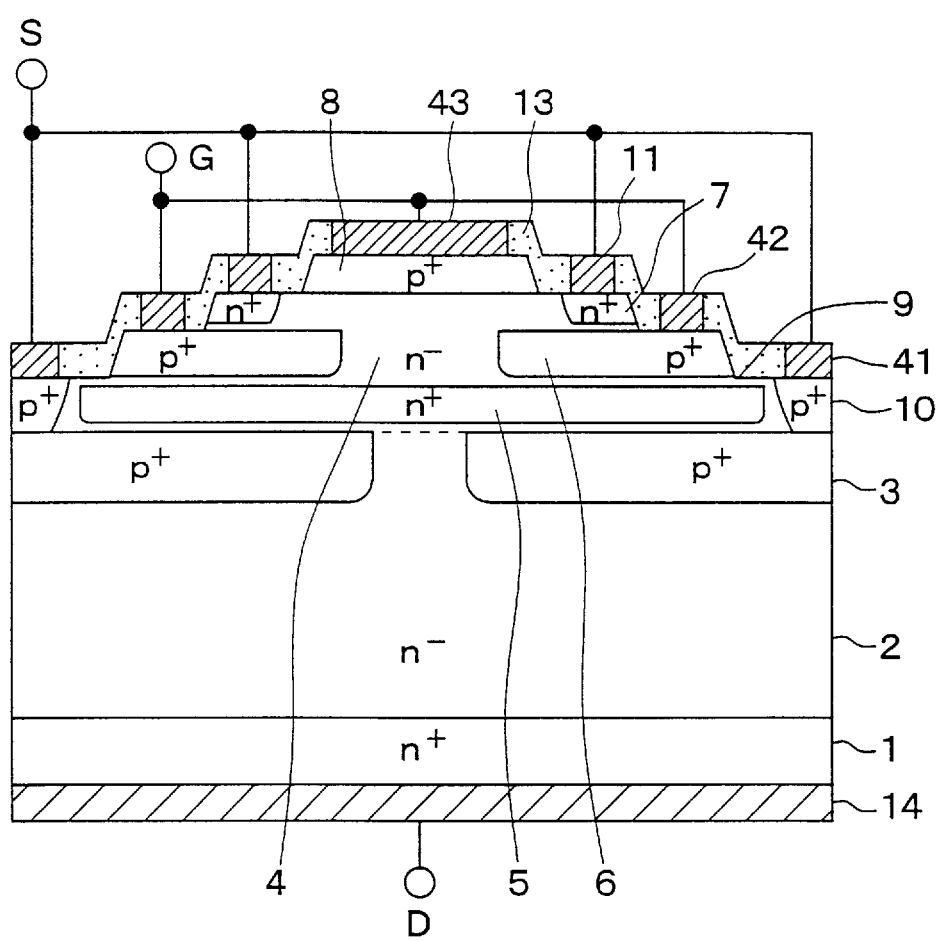
FIG. 32 is a cross sectional diagram showing the silicon carbide semiconductor device of the nineteenth embodiment of the present invention.

FIG. 32 shows a cross-sectional view of the silicon carbide semiconductor device of the nineteenth embodiment of the present invention. As in the third embodiment, the device structure of this embodiment has the field enhanced area 5 placed in the device structure of the seventeenth embodiment in such a way that the field enhanced area 5 functions as a resistor component of the J-FET. This structure yields similar effects as the third embodiment on the J-FET described in the seventeenth embodiment.

A manufacturing method of this silicon carbide semiconductor device is similar to the seventeenth embodiment, except for a modification in the mask patterns for forming the field enhanced area 5.

Twentieth Embodiment

Figure 33:
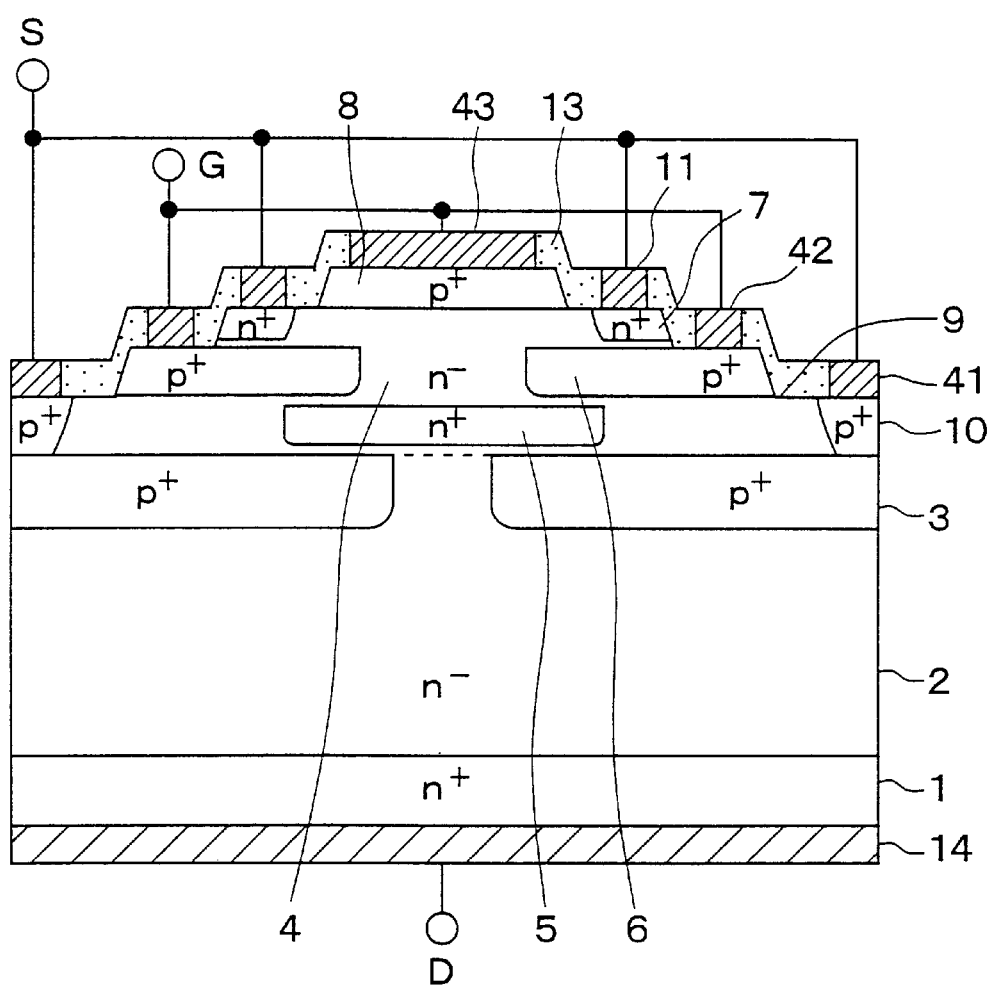
FIG. 33 is a cross sectional diagram showing the silicon carbide semiconductor device of the twentieth embodiment of the present invention.

FIG. 33 shows a cross-sectional view of the silicon carbide semiconductor device of the twentieth embodiment of the present invention. This embodiment combines the device structure of the seventeenth embodiment with the field enhanced area 5, as in the fourth embodiment, which is positioned only in an area where the field enhanced area 5 would function as a resistive component of the J-FET. This device structure offers similar effects as the fourth embodiment in the J-FET of the seventeenth embodiment.

A method of manufacturing this silicon carbide semiconductor device is similar to the seventeenth embodiment except for a modification in the mask patterns for forming the field enhanced area 5.

Twenty-First Embodiment

Figure 34:
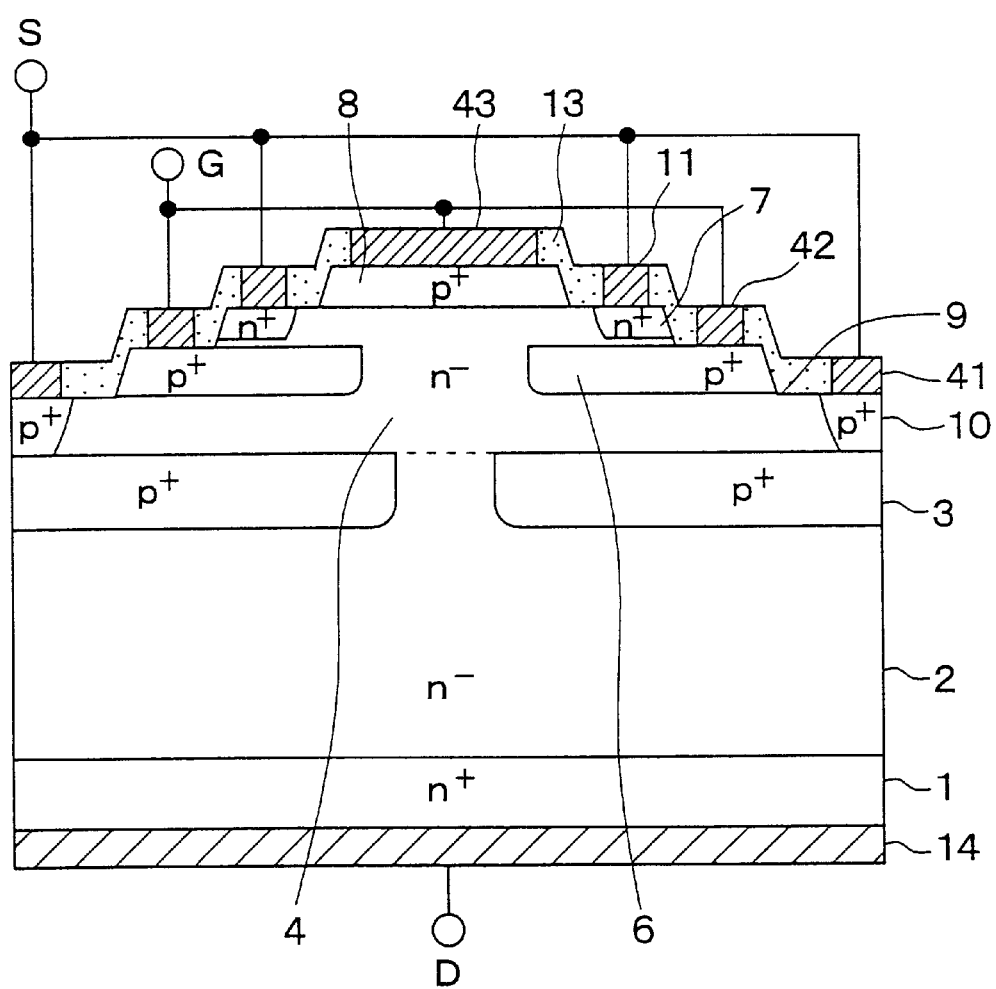
FIG. 34 is a cross sectional diagram showing the silicon carbide semiconductor device of the twenty-first embodiment of the present invention.

FIG. 34 shows a cross-sectional view of the silicon carbide semiconductor device of the twenty-first embodiment of the present invention. With this embodiment, the device structure of the seventeenth embodiment is combined with the device structure of the fifth embodiment, in which the field enhanced area 5 is eliminated, and an area sandwiched between the first and second gate areas 3 and 6 in the channel layer 4 has a higher level of impurity concentration than other areas.

This device structure yields similar effects as the device structure in the seventeenth embodiment. A method of manufacturing this silicon carbide semiconductor device is similar to the seventeenth embodiment, except that the step for forming the field enhanced area 5 is eliminated.

Twenty-Second Embodiment

Figure 35:
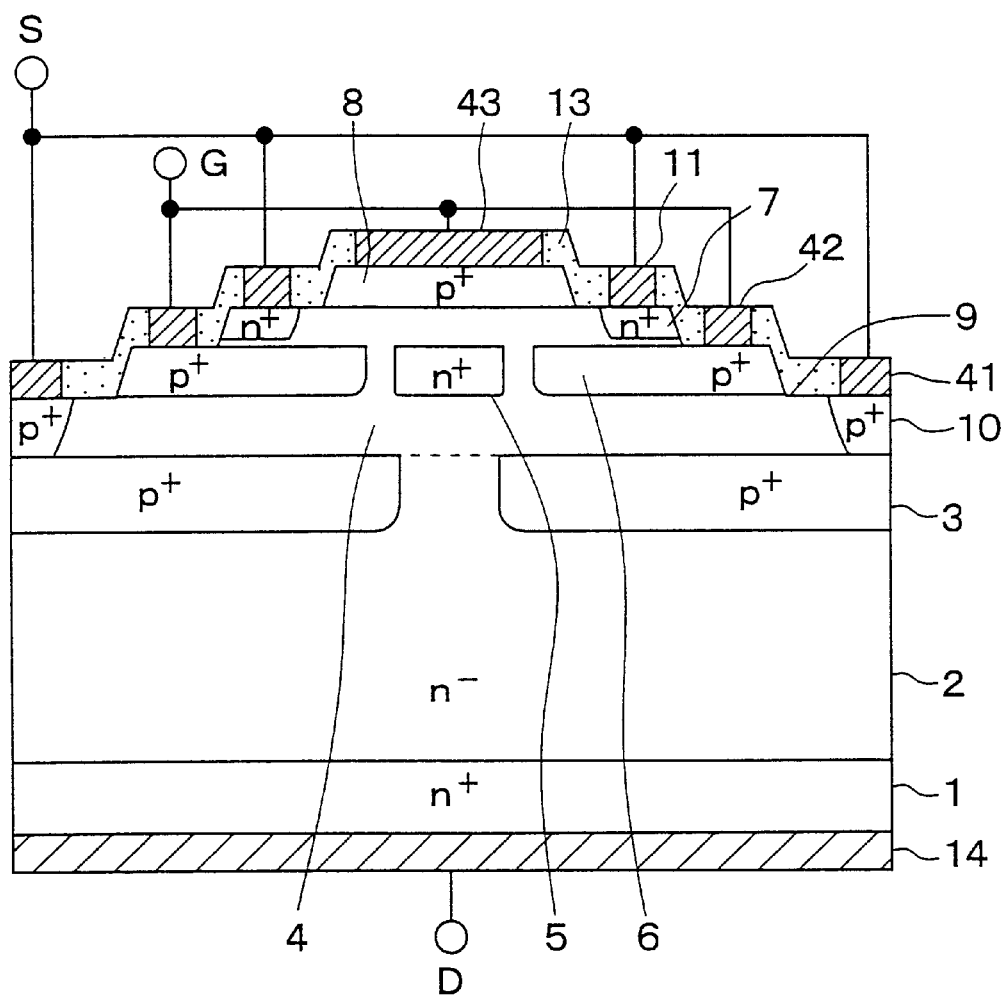
FIG. 35 is a cross sectional diagram showing the silicon carbide semiconductor device of the twenty-second embodiment of the present invention.

FIG. 35 shows a cross-sectional view of the silicon carbide semiconductor device in the twenty-second embodiment of the present invention. With this embodiment, the device structure in the seventeenth embodiment is combined with the device structure in the eighth embodiment in which the field enhanced area 5 is placed between the neighboring second gate areas 6. This device offers similar effects as the seventeenth embodiment while reducing the J-FET resistance between the second gate areas 6 and reducing the on resistance.

A method of manufacturing this silicon carbide semiconductor device in this embodiment is similar to the seventeenth embodiment, except for a modification in the mask patterns for forming the field enhanced area 5 and a modification in the ion implanting conditions.

Twenty-Third Embodiment

Figure 36:
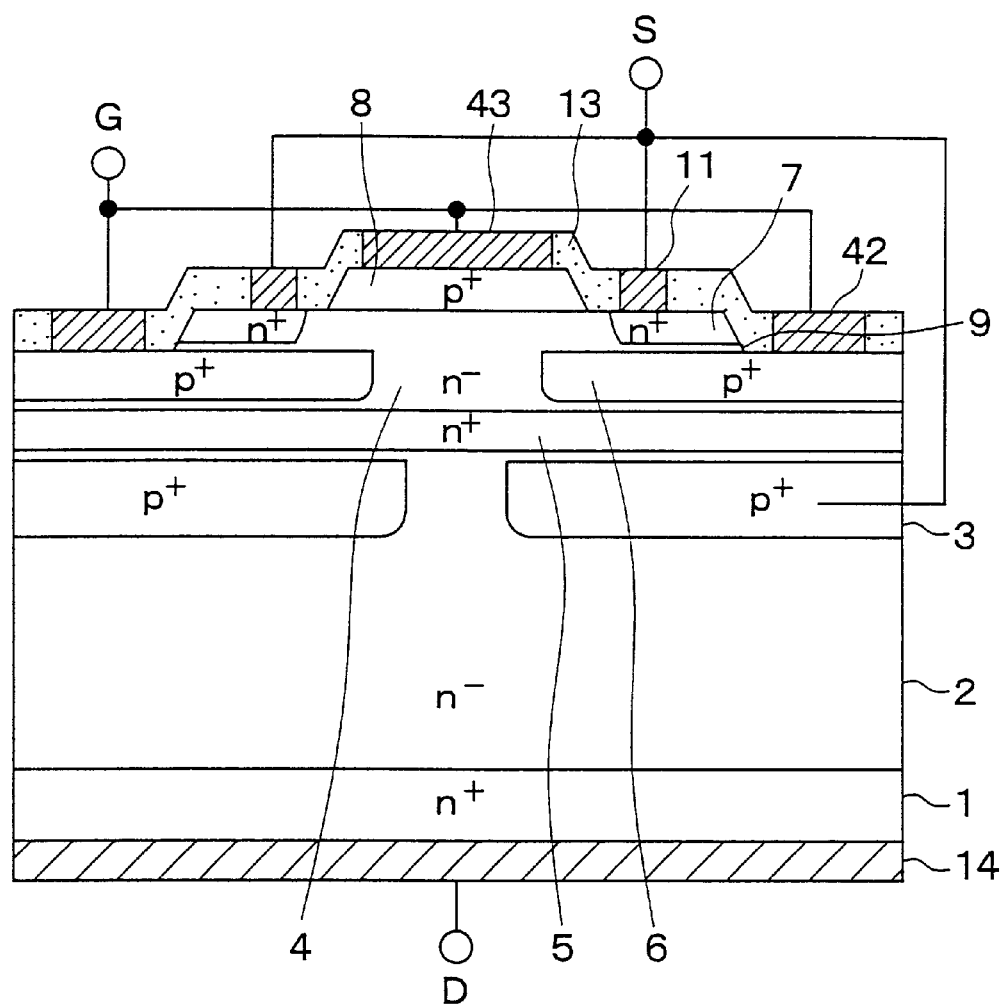
FIG. 36 is a cross sectional diagram showing the silicon carbide semiconductor device of the twenty-third embodiment of the present invention.

FIG. 36 shows a cross-sectional view of the silicon carbide semiconductor device of the twenty-third embodiment of the present invention. The device structure in this embodiment combines the device structure in the seventeenth embodiment with the device structure in the ninth embodiment, in which the field enhanced area 5 is formed across the entire cell, and the first gate areas 3 and source electrodes 11 are electrically connected at outside of the cell. This device structure yields similar effects as the seventeenth embodiment. Also in this structure the first gate electrodes, which are in contact with the first gate areas 3, are placed outside of the cell, and the first gate electrodes and the source electrodes 11 are connected at outside the cell.

A method of manufacturing the silicon carbide semiconductor device of the present embodiment is similar to the seventeenth embodiment, except that the step for forming the contact areas 10 is eliminated. The field enhanced area 5 may be formed by ion implanting, in a way similar to the seventeenth embodiment, but the field enhanced area 5 may also be formed by epitaxial growth.

Twenty-Fourth Embodiment

Figure 37:
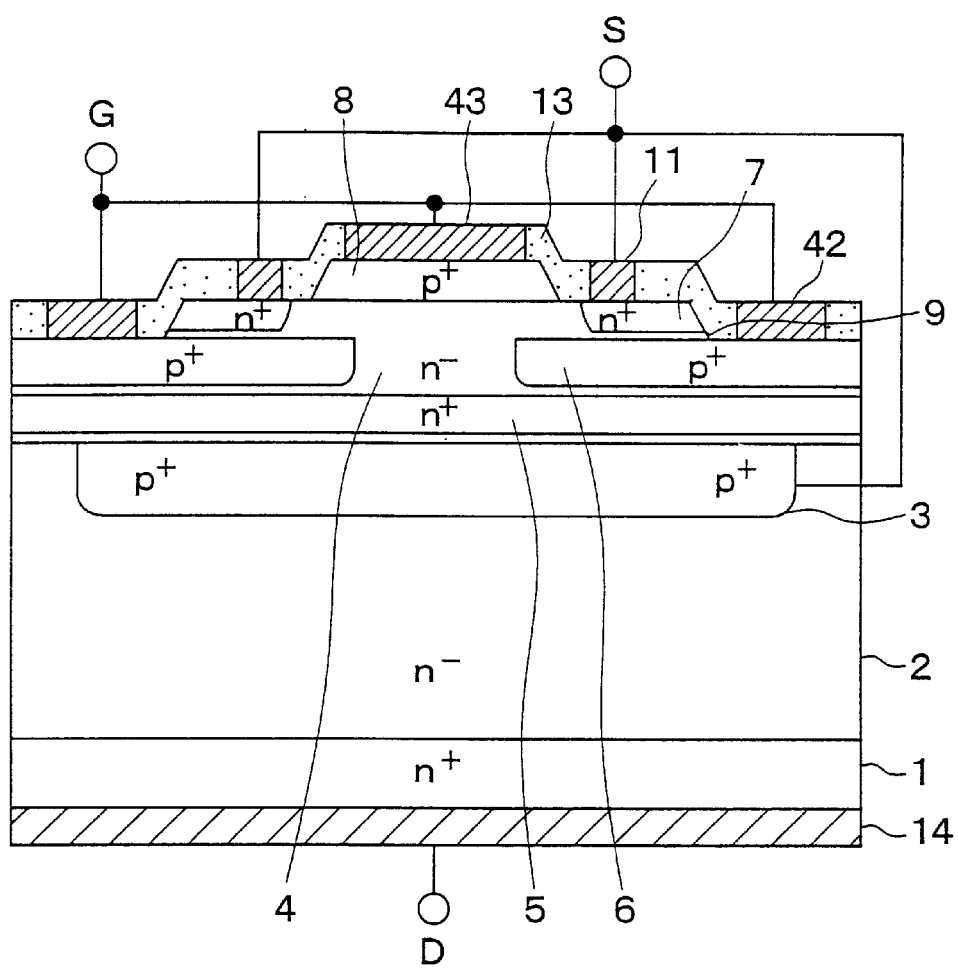
FIG. 37 is a cross sectional diagram showing the silicon carbide semiconductor device of the twenty-fourth embodiment of the present invention.

FIG. 37 shows a cross-sectional view of the silicon carbide semiconductor device of the twenty-fourth embodiment of the present invention. The device structure in this invention combines the device structure of the seventeenth embodiment and the layout of the first gate areas 3 in the tenth embodiment. The resulting structure yields similar effects as the tenth embodiment on the J-FET of the seventeenth embodiment.

A method of manufacturing the silicon carbide semiconductor device of the present embodiment is similar to the seventeenth embodiment, except for a modification in the mask patterns for forming the first gate areas 3.

Twenty-Fifth Embodiment

Figure 38:
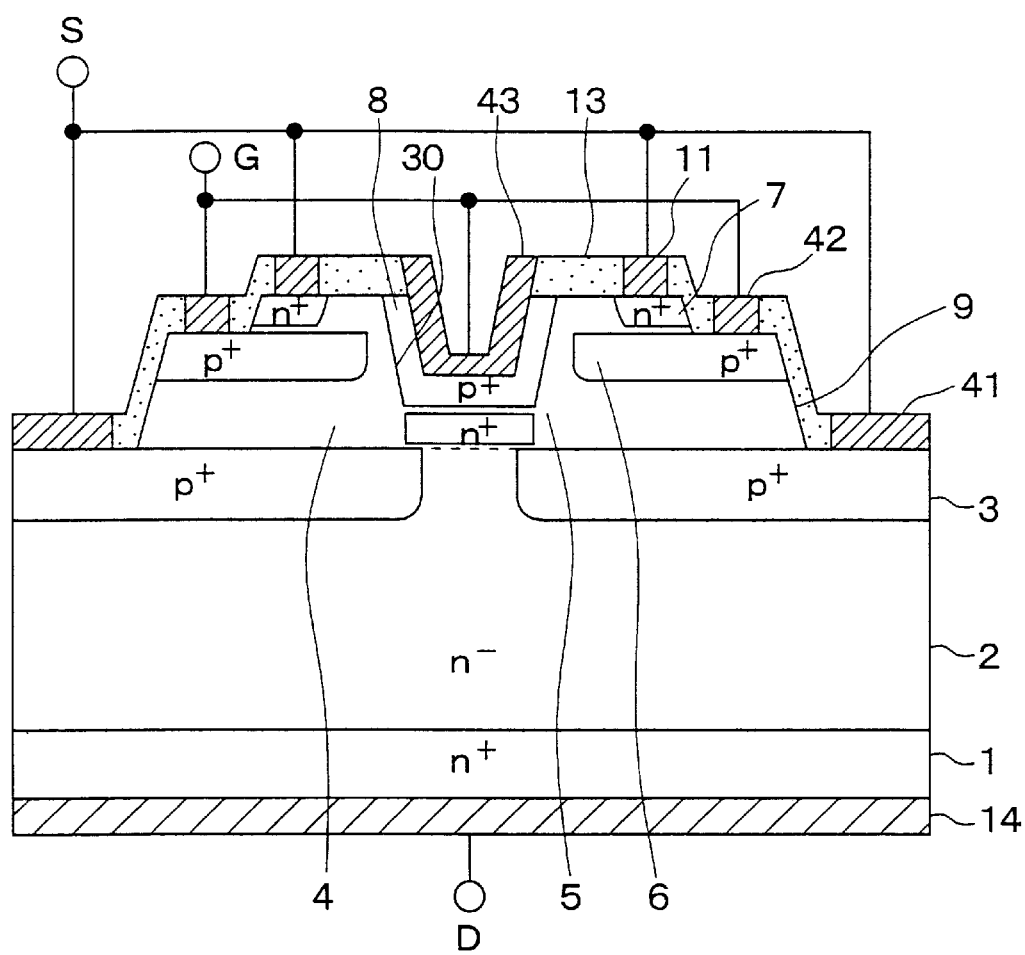
FIG. 38 is a cross sectional diagram showing the silicon carbide semiconductor device of the twenty-fifth embodiment of the present invention.

FIG. 38 shows a cross-sectional view of the silicon carbide semiconductor device of the twenty-fifth embodiment of the present invention. This embodiment applies one of the embodiments of the present invention on a silicon carbide semiconductor device having a trench, double-gate drive J-FET and is comparable to the transformation of the trench, single-gate drive J-FET of the eleventh embodiment into the double-gate drive structure of the eighteenth embodiment.

In other words, the device structure of this embodiment differs from the device structure of the eleventh embodiment in that the grooves 9 reach down to the first gate areas 3; the first, second, and third gate areas 3, 6, and 8, respectively, are connected separately to the first, second, and third gate electrodes 41, 42, and 43, respectively; the first gate electrode 41 is connected to the source electrode 11 and is grounded; and the second gate electrodes 42 and the third electrodes 43 are connected to each other and able to control the potential levels of the second and third gate areas 6 and 8. In other respects, the device structure of the present embodiment is similar to the eleventh embodiment.

The silicon carbide semiconductor device having the double-gate drive J-FET structure offers similar effects as the first embodiment.

A method of manufacturing the silicon carbide semiconductor device of the present embodiment is similar to the eleventh embodiment, except that, after a step for forming the grooves 9 shown in the eleventh embodiment (shown in FIG. 23B), another mask with prescribed patterns is formed, and etching is performed using this mask to make the grooves 9 penetrate through the second gate areas 6.

Twenty-Sixth Embodiment

Figure 39:
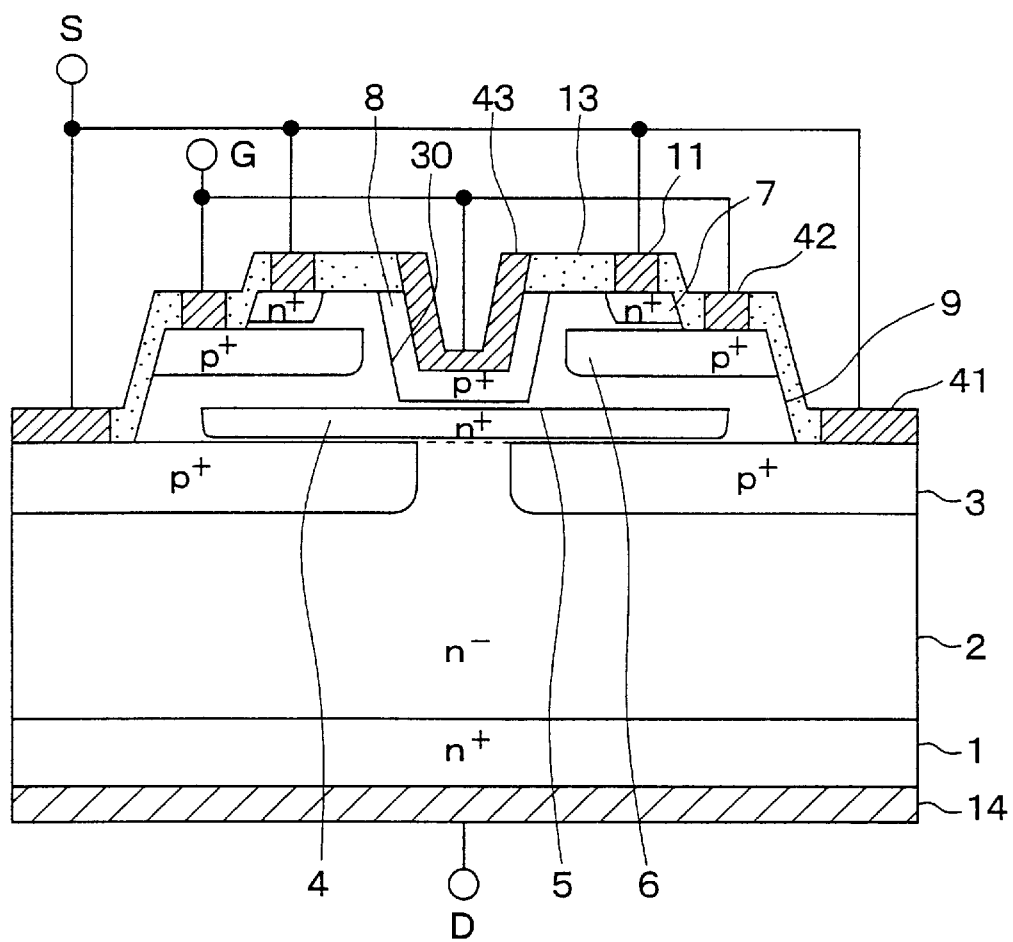
FIG. 39 is a cross sectional diagram showing the silicon carbide semiconductor device of the twenty-sixth embodiment of the present invention.

FIG. 39 shows a cross-sectional view of the silicon carbide semiconductor device of the twenty-sixth embodiment of the present invention. The device structure of this embodiment has a wider field enhanced area 5 compared with the twenty-fifth embodiment. This device structure yields similar effects as the twenty-fifth embodiment.

A method of manufacturing the silicon carbide semiconductor device of the present embodiment is similar to the twenty-fifth embodiment, except that the field enhanced area 5 is formed by ion implanting using a mask with prescribed patterns after the channel layer 4 is formed.

Twenty-Seventh Embodiment

Figure 40:
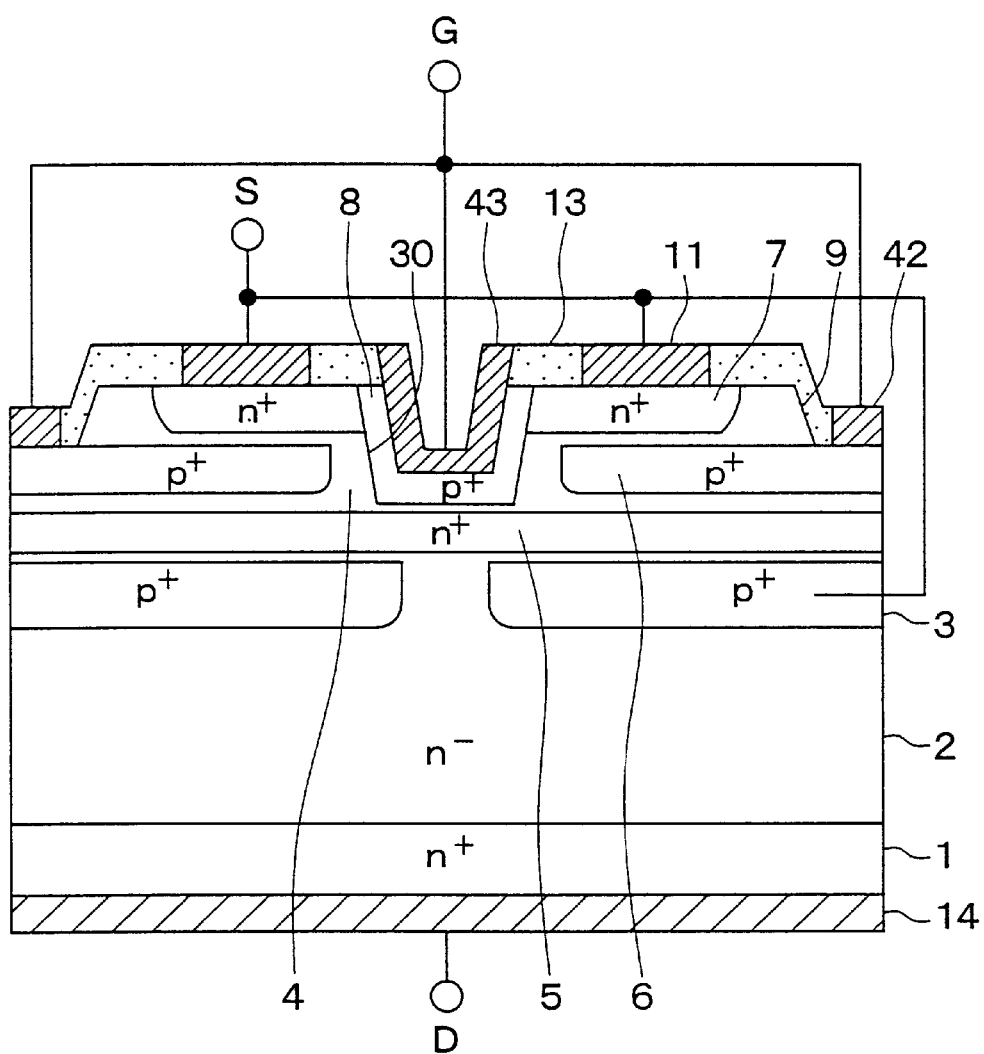
FIG. 40 is a cross sectional diagram showing the silicon carbide semiconductor device of the twenty-seventh embodiment of the present invention.

FIG. 40 shows a cross-sectional view of the silicon carbide semiconductor device of the twenty-seventh embodiment of the present invention. The device structure of this embodiment combines the device structure of the twelfth embodiment and the double-gate structure of the twenty-fifth embodiment. The resulting double-gate structure, similar to the twelfth embodiment, offers similar effects as the device structure of the twelfth embodiment. In this structure, the first gate electrodes that are in contact with the first gate areas 3 are placed outside of the cell, and the first gate electrodes and the source electrodes 11 are connected at outside of the cell.

Twenty-Eighth Embodiment

Figure 41:
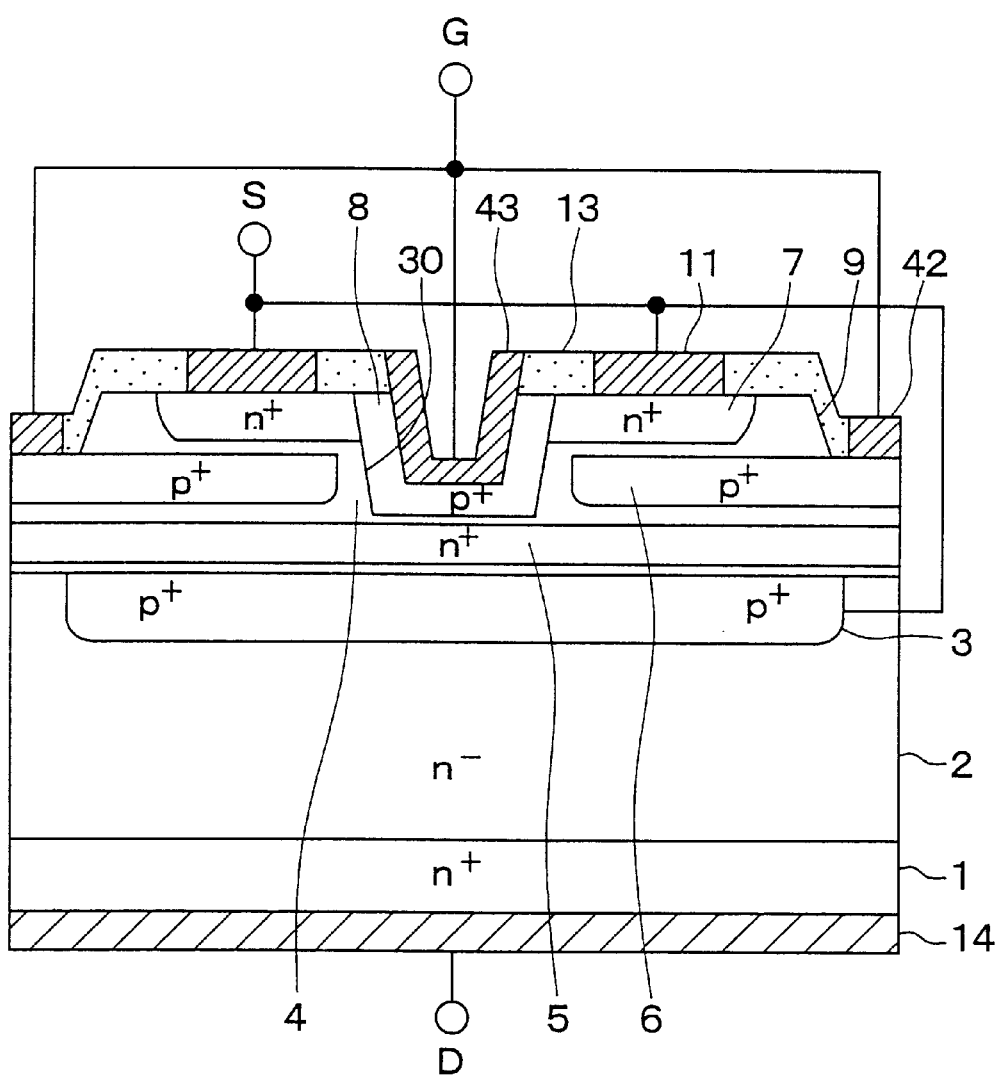
FIG. 41 is a cross sectional diagram showing the silicon carbide semiconductor device of the twenty-eighth embodiment of the present invention.

FIG. 41 shows a cross-sectional view of the silicon carbide semiconductor device of the twenty-eighth embodiment of the present invention. The device structure of this embodiment combines the device structure of the thirteenth embodiment and the double-gate structure of the twenty-fifth embodiment. This device structure offers a double-gate structure similar to the thirteenth embodiment and offers effects that are similar to the thirteenth embodiment. In this device structure, the first gate electrodes in contact with the first gate areas 3 are also outside of the cell, and the first gate electrodes and source electrodes 11 are connected at outside of the cell.

Twenty-Ninth Embodiment

Figure 42:
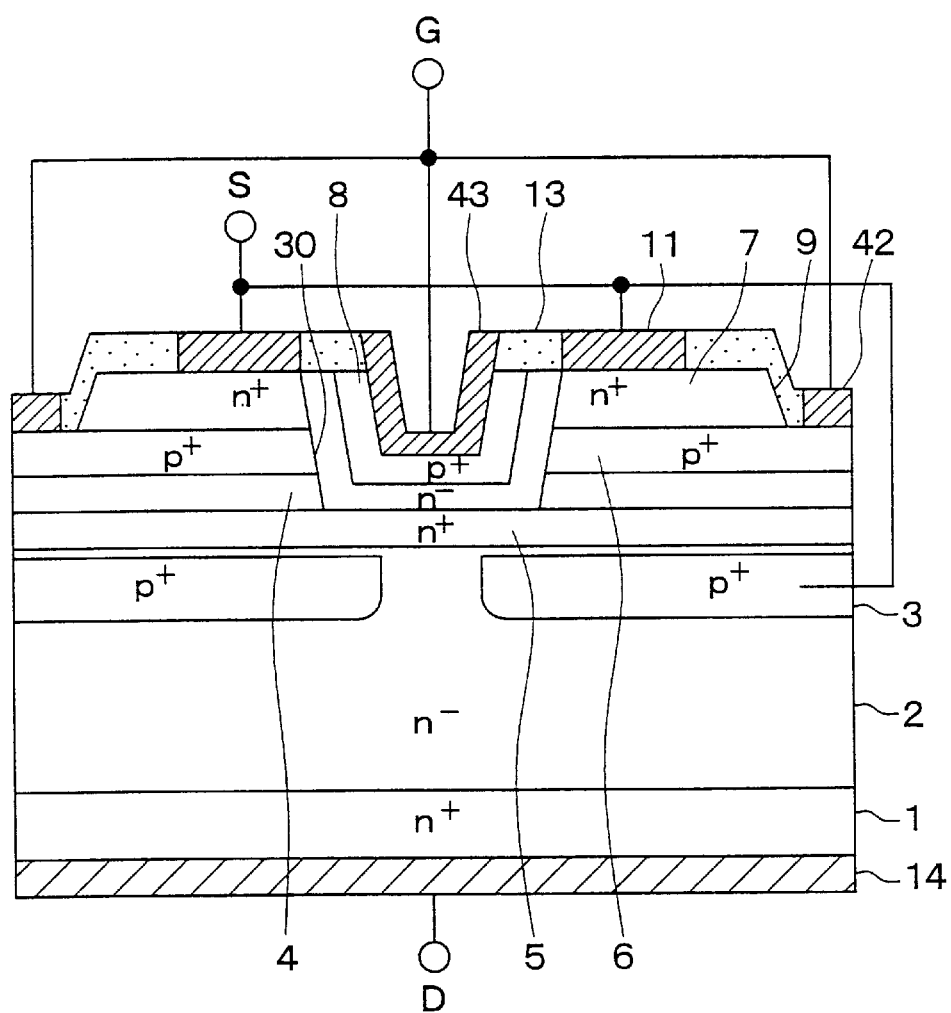
FIG. 42 is a cross sectional diagram showing the silicon carbide semiconductor device of the twenty-ninth embodiment of the present invention.

FIG. 42 shows a cross-sectional view of the silicon carbide semiconductor device of the twenty-ninth embodiment of the present invention. The device structure of this embodiment combines the device structure of the fourteenth embodiment and the double-gate structure of the twenty-fifth embodiment. This device structure offers a double-gate structure similar to the fourteenth embodiment and offers the same effects as the fourteenth embodiment. The first gate electrodes connected to the first gate areas 3 are also outside of the cell, and the first gate electrodes are connected to the source electrodes 11 at outside of the cell.

Thirtieth Embodiment

Figure 43:
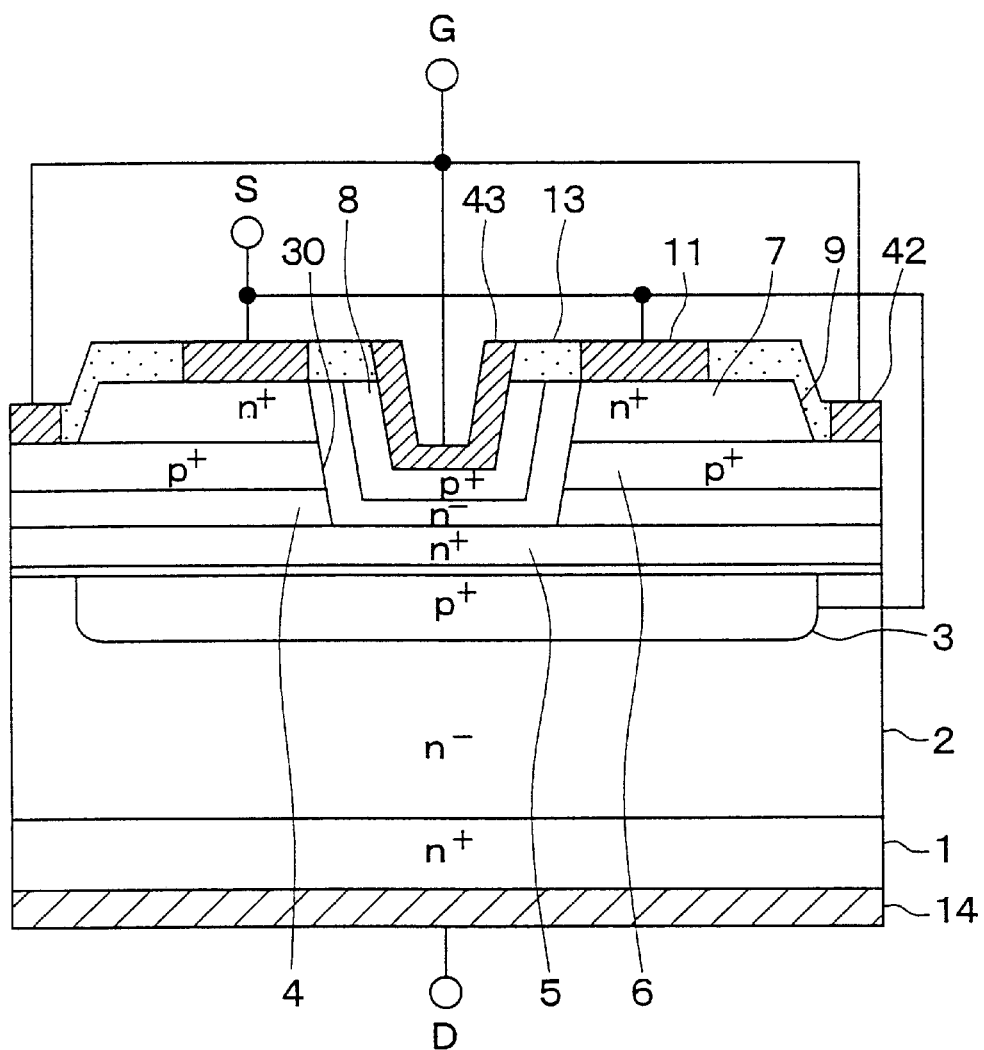
FIG. 43 is a cross sectional diagram showing the silicon carbide semiconductor device of the thirtieth embodiment of the present invention.

FIG. 43 shows a cross-sectional view of the silicon carbide semiconductor device of the thirtieth embodiment of the present invention. The device structure of this embodiment combines the device structure of the fifteenth embodiment and the double-gate structure of the twenty-fifth embodiment. This device structure offers a double-gate structure similar to the fifteenth embodiment and offers the same effects as the fifteenth embodiment. The first gate electrodes connected to the first gate areas 3 are also at the outside of the cell, and the first gate electrodes are connected to the source electrodes 11 at outside of the cell.

Thirty-First Embodiment

Figure 44:
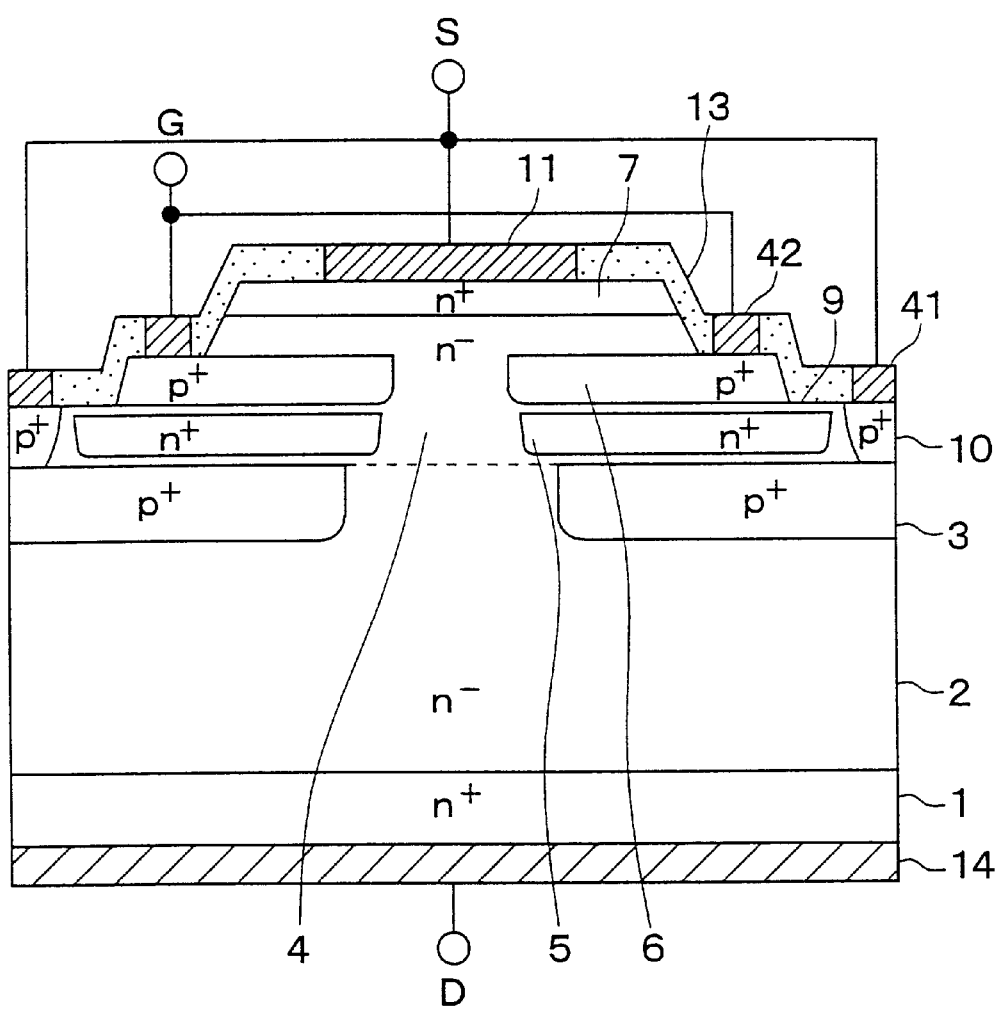
FIG. 44 is a cross sectional diagram showing the silicon carbide semiconductor device of the thirty-first embodiment of the present invention

FIG. 44 shows a cross-sectional view of the silicon carbide semiconductor device of the thirty-first embodiment of the present invention. This embodiment applies one of the embodiments of the present invention on the silicon carbide semiconductor device having a single-gate J-FET. This silicon carbide semiconductor device is described and compared with the silicon carbide semiconductor device in FIG. 30.

As shown in FIG. 44, in this embodiment, spacing between the neighboring second gate areas 6 is much smaller than in FIG. 30. Furthermore, the $n^+$-type source area 7 in this embodiment is placed where the third gate area 8 is located in FIG. 30, and the third gate area 8 is eliminated. In addition, the first gate areas 3 are connected to the source electrodes 11 through the first gate electrodes 41 and to the ground, and the second gate areas 6 are driven through the second gate electrodes 42.

This device structure includes a vertical J-FET, the channel of which, formed between neighboring second gate areas 6, is controlled by the distance by which depletion layers from the second gate areas 6 extend. This vertical J-FET is comparable to the second J-FET of the various embodiments discussed earlier.

This silicon carbide semiconductor device, which has a double-gate structure, the first and second J-FETs of which are both vertical J-FETs, has effects similar to those of the first embodiment.

A method of manufacturing this silicon carbide semiconductor device is similar to the method of the seventeenth embodiment. After the second gate areas 6 and field enhanced areas 5 are formed in the channel layer 4, an $n^+$-type source area 7 is formed by depositing an $n^+$-type layer on the surface of the channel layer 4.

Thirty-Second Embodiment

Figure 45:
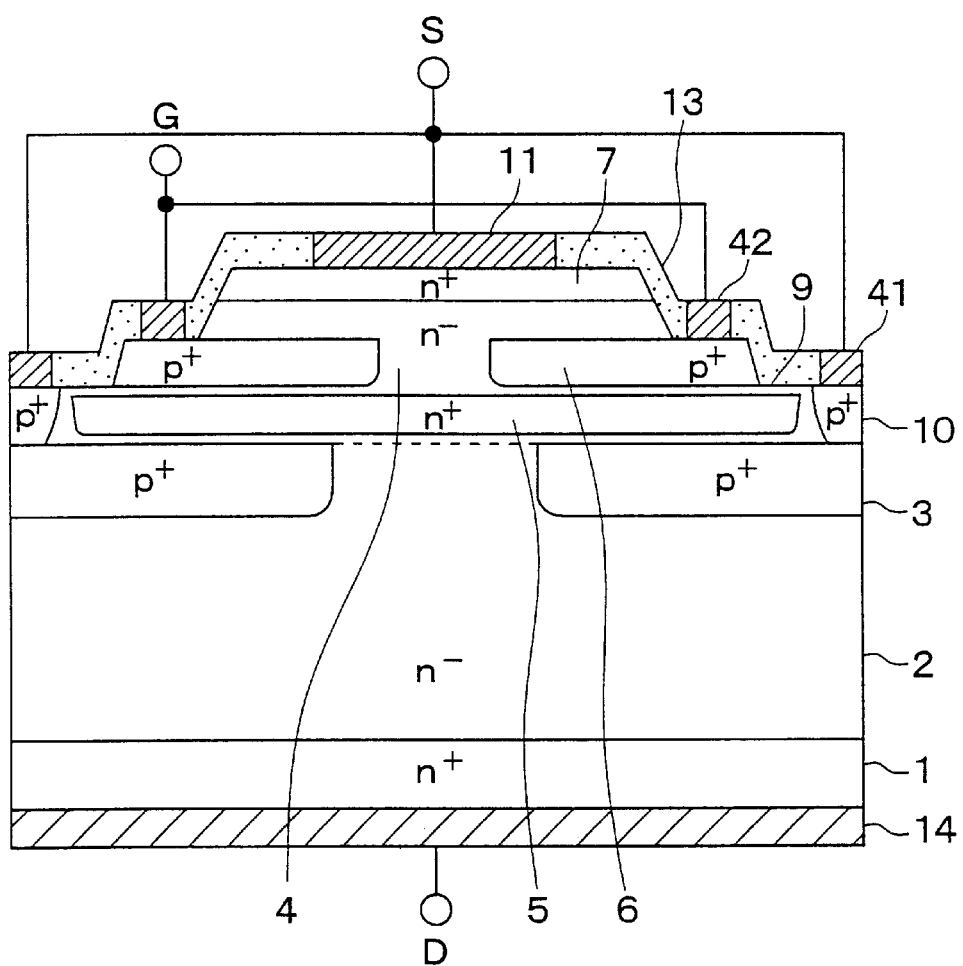
FIG. 45 is a cross sectional diagram showing the silicon carbide semiconductor device of the thirty-second embodiment of the present invention.

FIG. 45 shows a cross-sectional view of the silicon carbide semiconductor device of the thirty-second embodiment of the present invention. The device structure of the present embodiment has a wider stretching field enhanced area 5 compared with the thirty-first embodiment. This device structure has effects similar to those of the thirty-first embodiment.

A method of manufacturing the silicon carbide semiconductor device of the present embodiment is similar to the method of the thirty-first embodiment, except for a modification in the mask patterns for forming the field enhanced area 5.

Thirty-Third Embodiment

Figure 46:
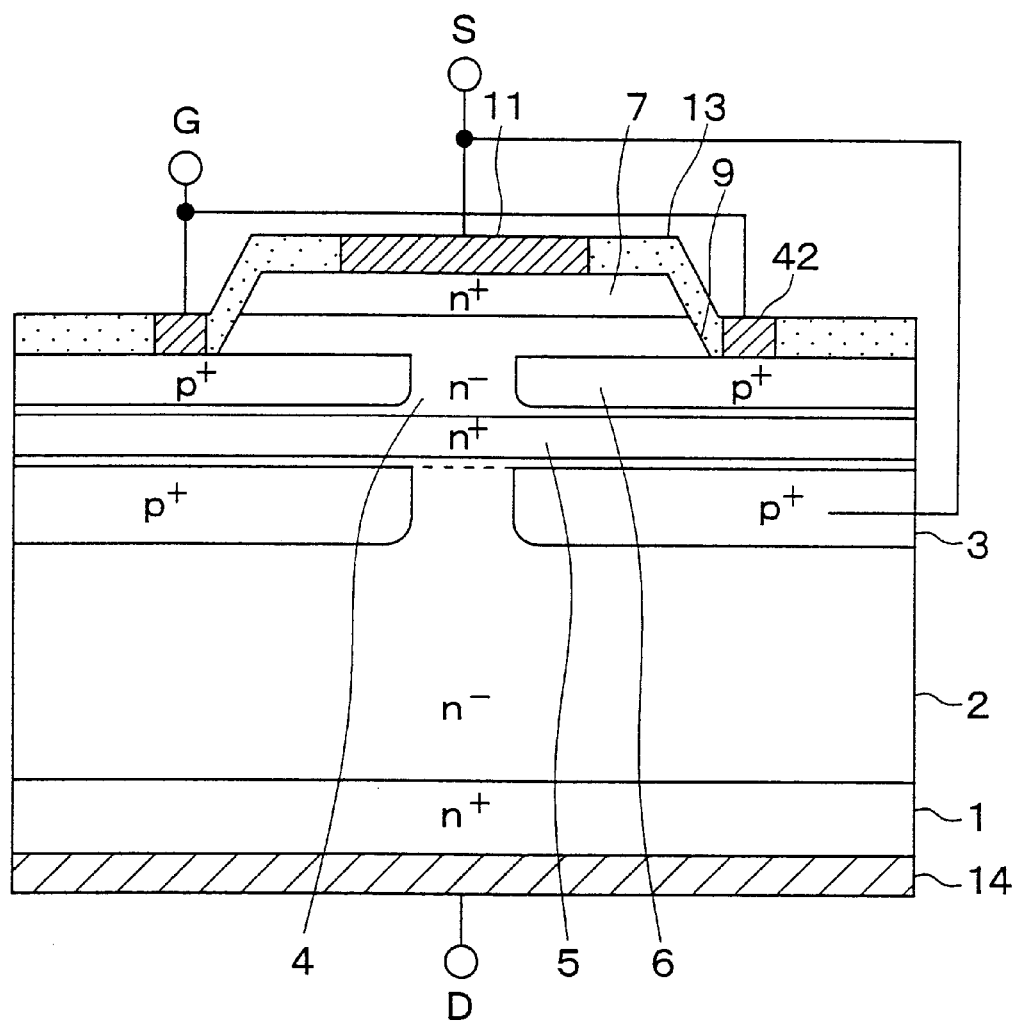
FIG. 46 is a cross sectional diagram showing the silicon carbide semiconductor device of the thirty-third embodiment of the present invention.

FIG. 46 shows a cross-sectional view of the silicon carbide semiconductor device of the thirty-third embodiment of the present invention. The device structure of this embodiment combines the device structures of the thirty-first embodiment and the ninth embodiment. In other words, the field enhanced area 5 spreads across the entire cell, and the first gate areas 3 are electrically connected to the source electrodes 11 at outside of the cell. This device structure has effects similar to those of the device of the thirty-first embodiment.

A method of manufacturing the silicon carbide semiconductor device of the present embodiment is similar to the thirty-first embodiment, except that the step for forming the contact areas 10 is eliminated. The field enhanced area 5 may be formed by ion implanting as in the thirty-first embodiment or by epitaxial growth.

Thirty-Fourth Embodiment

Figure 47:
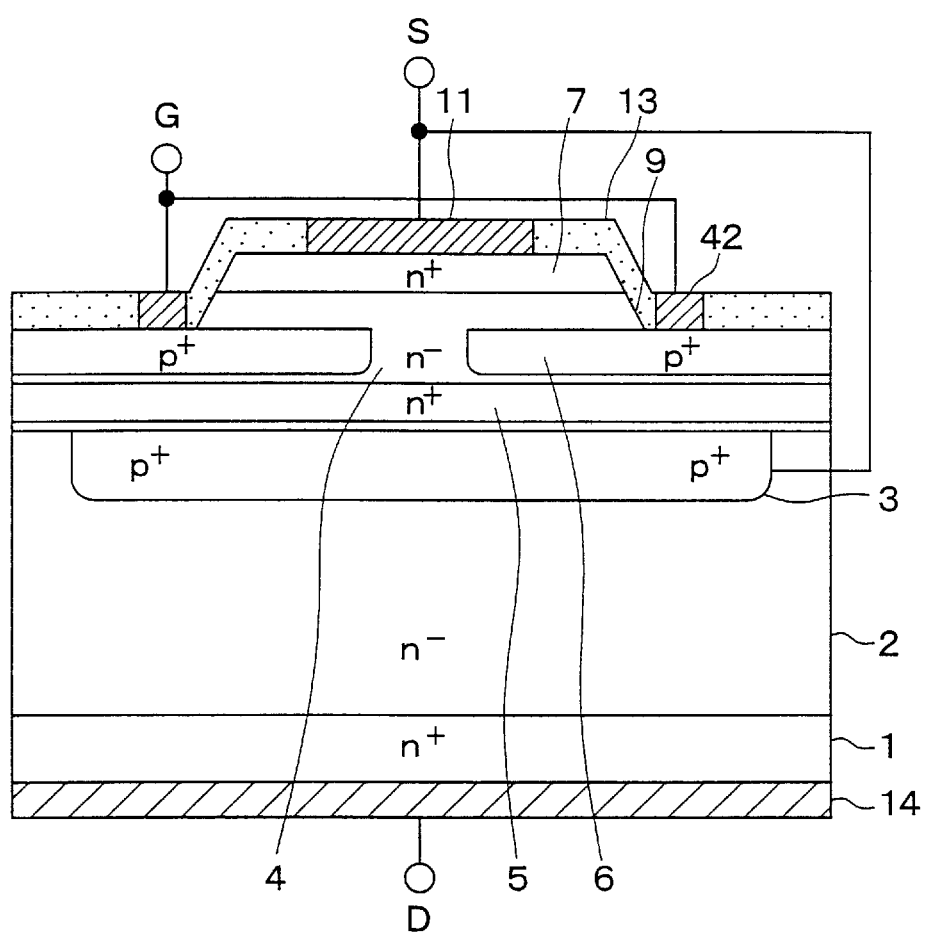
FIG. 47 is a cross sectional diagram showing the silicon carbide semiconductor device of the thirty-fourth embodiment of the present invention.

FIG. 47 shows a cross-sectional view of the silicon carbide semiconductor device of the thirty-fourth embodiment of the present invention. The device structure in this embodiment combines the device structure in the thirty-first embodiment and the layout of the first gate electrodes 3 in the tenth embodiment. This device structure offers a J-FET structure of the thirty-first embodiment with the effects similar to the tenth embodiment.

A method of manufacturing the silicon carbide semiconductor device of the present embodiment is similar to the thirty-first embodiment, except for a modification in the mask patterns for forming the first gate areas 3.

Thirty-Fifth Embodiment

Figure 48:
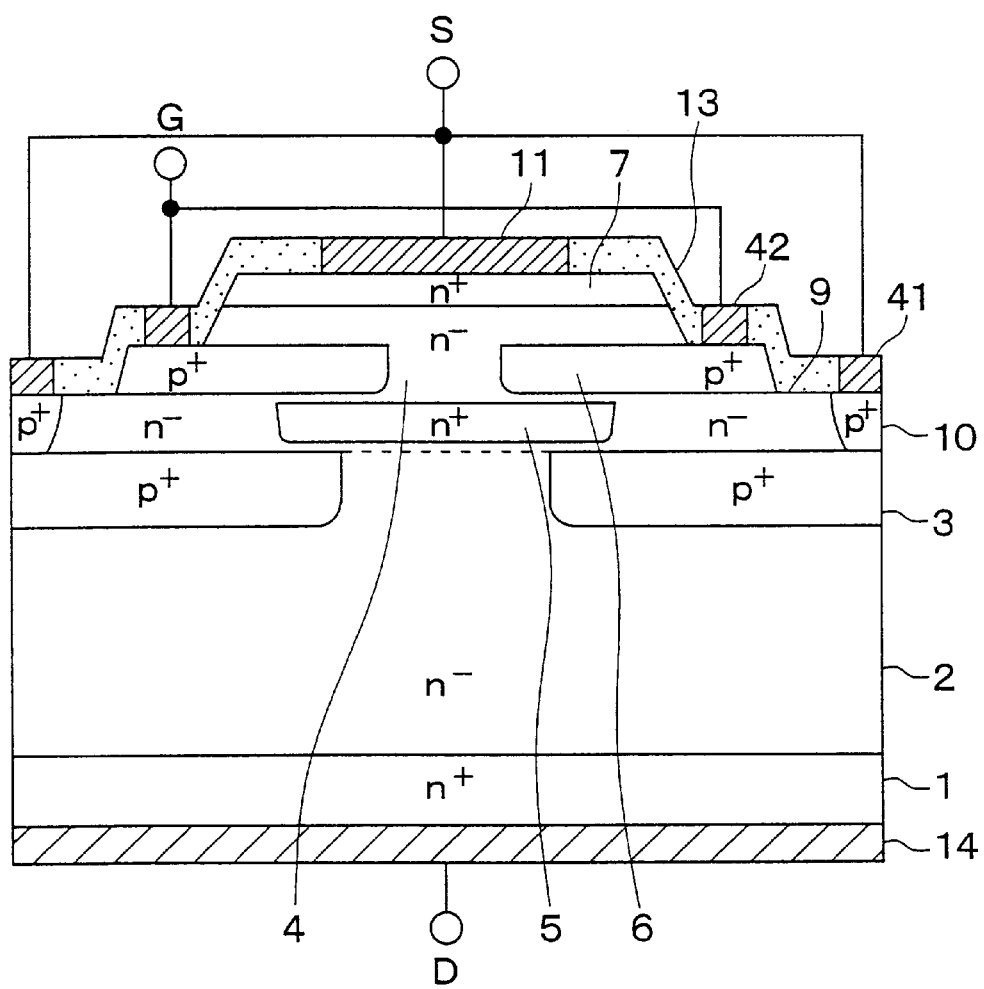
FIG. 48 is a cross sectional diagram showing the silicon carbide semiconductor device of the thirty-fifth embodiment of the present invention.

FIG. 48 shows a cross-sectional view of the silicon carbide semiconductor device of the thirty-fifth embodiment of the present invention. The device structure of this embodiment combines the device structure of the thirty-first embodiment with the field enhanced area of the fourth embodiment, which is positioned only at a spot where the field enhanced area 5 functions as a resistor component of the J-FET. This device structure offers similar effects on the J-FET of the thirty-first embodiment as those of the fourth embodiment.

A method of manufacturing the silicon carbide semiconductor device of the present embodiment is similar to the thirty-first embodiment, except for a modification in the mask patterns for forming the field enhanced area 5.

Thirty-Sixth Embodiment

Figure 49:
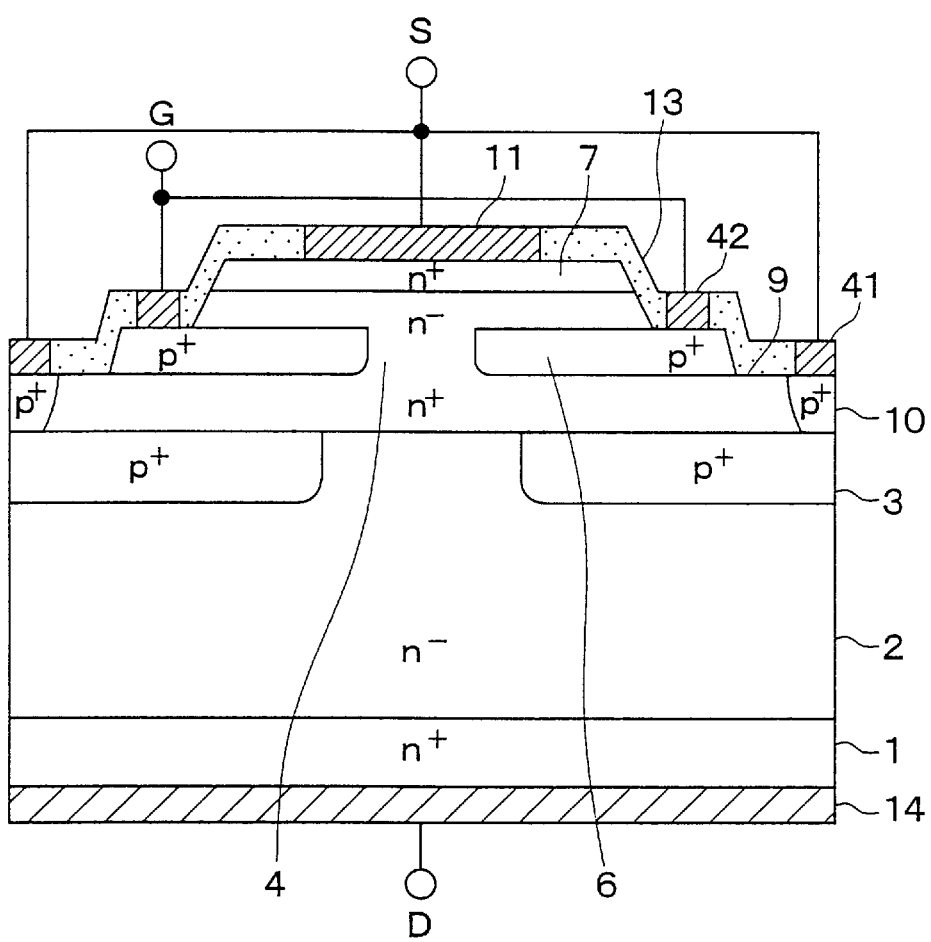
FIG. 49 is a cross sectional diagram showing the silicon carbide semiconductor device of the thirty-sixth embodiment of the present invention.

FIG. 49 shows a cross-sectional view of the silicon carbide semiconductor device of the thirty-sixth embodiment of the present invention. The device structure of this embodiment combines the device structure of the thirty-first embodiment with the device structure of the fifth embodiment, in which the field enhanced area 5 is eliminated, and an area sandwiched between the first and second gate areas 3 and 6 in the channel layer 4 has a higher level of impurity concentration than other areas. This structure offers similar effects on the J-FET of the thirty-first embodiment as those of the fifth embodiment.

A method of manufacturing the silicon carbide semiconductor device of this embodiment is similar to the thirty-first embodiment, except that the step for forming the field enhanced area 5 is eliminated.

Other Embodiments

Silicon carbide semiconductor devices having a single-gate structure, the first and second gate areas 3 and 6 of which are at the same potential as the $n^+$-type source areas 7, were described in the various embodiments above. The silicon carbide semiconductor devices may also have a double-gate structure, the potential levels for the first and second gate areas 3 and 6 of which are controlled independently of the $n^+$-type source areas 7.

Furthermore, impurity concentration levels in the drift area 2 and the channel layer 4 may be controlled independently. This would make it easier to design normally-on and normally-off FETs. Various n-channel silicon carbide semiconductor devices were described in the embodiments above. The present invention, of course, would also be applicable to silicon carbide semiconductor devices in which the conductance types in the various parts are reversed from those illustrated.

What is claimed is:

1. A silicon carbide semiconductor device comprising:
   a semiconductor substrate of a first conductance type consisting of silicon carbide;
   a semiconductor layer of the first conductance type consisting of silicon carbide of a higher resistance than the semiconductor substrate and formed on a main surface of the semiconductor substrate;
   first gate areas of a second conductance type formed on both sides of a prescribed area in a surface part, which is to become a channel, of the semiconductor layer;
   a channel layer of the first conductance type formed on the first gate areas and the semiconductor layer;
   second gate areas of the second conductance type formed in isolation from the first gate areas in the channel layer;
   a high impurity concentration area or a plurality of high impurity concentration areas of the first conductance type formed in the channel layer;
   source area of the first conductance type formed above the first gate areas in the channel layer;
   a third gate area of the second conductance type formed above the channel layer or in the surface part of the channel layer and having parts facing the second gate areas;
   source electrodes electrically connected to the first gate areas and the source areas;
   a gate electrode electrically connected to the third gate area; and
   a drain electrode formed on a backside of the semiconductor substrate.

2. The silicon carbide semiconductor device of claim 1, wherein the second gate areas are connected to the source electrodes.

3. The silicon carbide semiconductor device of claim 1, wherein the silicon carbide semiconductor device comprises contact areas of the second conductance type electrically connected to the first and the second gate areas, wherein the first and second gate areas are connected to the source electrodes through the contact areas.

4. The silicon carbide semiconductor device of claim 3, wherein the high impurity concentration areas are isolated from the contact areas.

5. The silicon carbide semiconductor device of claim 3, wherein the silicon carbide semiconductor device comprises grooves extending to the second gate areas from the surface of the channel layer, and the contact areas extend from the bottom of the grooves to the first gate areas.

6. The silicon carbide semiconductor device of claim 3, wherein the silicon carbide semiconductor device comprises low impurity concentration areas formed by diffusion from the contact areas, and the second gate areas are in electrical contact with the contact areas through the low impurity concentration areas.

7. The silicon carbide semiconductor device of claim 6, wherein the high impurity concentration areas are formed in contact with the low impurity concentration areas.

8. The silicon carbide semiconductor device of claim 1, wherein the second gate areas are in a floating state.

9. The silicon carbide semiconductor device of claim 1, wherein a trench is formed in the channel layer down to the second gate areas, the third gate is formed in the trench in isolation from the second gate areas, and the gate electrode is formed on the surface of the third gate area.

10. The silicon carbide semiconductor device of claim 9, wherein the high impurity concentration area is formed at the bottom of the trench in the channel layer.

11. A silicon carbide semiconductor device comprising:
    a semiconductor substrate of a first conductance type consisting of silicon carbide;

a semiconductor layer of the first conductance type consisting of silicon carbide of a higher resistance than the semiconductor substrate and formed on a main surface of the semiconductor substrate;

first gate areas of a second conductance type formed on both sides of a prescribed area in a surface part of the semiconductor layer, which is to become a channel;

a channel layer of the first conductance type formed over the first gate areas and the semiconductor layer;

second gate areas of the second conductance type formed above the first gate areas on both sides of the channel in the channel layer;

a high impurity concentration area of the first conductance type formed in the channel layer;

source areas of the first conductance type formed above the first gate areas in the channel layer;

a third gate area of the second conductance type having parts facing the second gate areas and formed above the channel layer or in the surface of the channel layer;

source electrodes electrically connected to the source areas;

first electrodes electrically connected to the first gate areas;

second electrodes electrically connected to the second gate areas;

a third electrode electrically connected to the third gate area; and a drain electrode formed on a backside of the semiconductor substrate.

12. The silicon carbide semiconductor device of claim 11, wherein the first electrodes are connected to the source electrodes.

13. The silicon carbide semiconductor device of claim 11, wherein the second electrodes and third electrodes are electrically connected, and potential for the second gate areas and potential for the third gate area are controlled together.

14. The silicon carbide semiconductor device of claim 11, wherein the silicon carbide semiconductor device comprises grooves formed from the surface of the channel layer down to the first gate areas, and the first gate areas and the source electrodes are electrically connected through the grooves.

15. The silicon carbide semiconductor device of claim 14, wherein the silicon carbide semiconductor device comprises contact areas 10 formed at the bottom of the grooves and in contact with the first gate areas, and the first gate areas are connected to the source areas through the contact areas.

16. The silicon carbide semiconductor device of claim 11, wherein a trench reaching down to the second gate areas is formed in the channel layer, the third gate area is positioned in the trench in isolation from the second gate areas, and the third electrode is formed on a surface of the third gate area.

17. The silicon carbide semiconductor device of claim 16, wherein the high impurity concentration area is positioned at the bottom of the trench in the channel layer.

18. A silicon carbide semiconductor device comprising:
a semiconductor substrate of a first conductance type consisting of silicon carbide;
a semiconductor layer of the first conductance type consisting of silicon carbide of a higher resistance than the semiconductor substrate and formed on a main surface of the semiconductor substrate;
first gate areas of a second conductance type formed on both sides of a prescribed area in a surface part of the semiconductor layer, which is to become a channel;
a channel layer of the first conductance type formed over the first gate areas and the semiconductor layer;
second gate areas of the second conductance type formed in isolation from the first gate areas on both sides of a prescribed area in the channel layer which is to become the second channel;
a high impurity concentration area or a plurality of high impurity concentration areas of the first conductance type formed in the channel layer;;
source areas of the first conductance type formed above the first gate areas in the surface of the channel layer or above the channel layer;
source electrodes electrically connected to the source areas;
first electrodes electrically connected to the source electrodes and to the first gate areas;
second electrodes electrically connected to the second gate areas; and
a drain electrode formed on a backside of the semiconductor substrate.

19. The silicon carbide semiconductor device of claim 18, wherein the silicon carbide semiconductor device comprises grooves formed from the surface of the channel layer down to the first gate areas, and the first gate areas and the source electrodes are electrically connected through the grooves.

20. The silicon carbide semiconductor device of claim 19, wherein the silicon carbide semiconductor device comprises contact areas in contact with the first gate areas are formed at the bottom of the grooves and the first gate areas are connected to the source areas through the contact areas.

21. The silicon carbide semiconductor device of claim 1, wherein the high impurity concentration area is formed between the first gate areas and second gate areas in the channel layer.

22. The silicon carbide semiconductor device of claim 1, wherein the high impurity concentration area is formed above the channel part in the semiconductor layer.

23. The silicon carbide semiconductor device of claim 1, wherein the high impurity concentration area is formed with a higher level of impurity concentration than an area between the second gate areas and the third gate area in the channel layer and is formed between the first gate areas and the second gate areas in the channel layer.

24. The silicon carbide semiconductor device of claim 1, wherein the high impurity concentration area is located between the second gate areas in the channel layer.

25. The silicon carbide semiconductor device of claim 1, wherein the high impurity concentration area is formed across the entire cell, and the first gate areas are connected to the source electrodes outside of the cell.

26. The silicon carbide semiconductor device of claim 1, wherein the second gate areas are formed above the first gate areas, which are on both sides of the channel.

27. The silicon carbide semiconductor device of claim 1, wherein the second gate areas cover a part of the channel formed by the first gate areas.

28. The silicon carbide semiconductor device of claim 1, wherein the impurity concentration level in the semiconductor layer is controlled independently of the impurity concentration level in the channel layer.

* * * * *